US012772592B2

(12) United States Patent
Chung et al.

(10) Patent No.: US 12,772,592 B2
(45) Date of Patent: Oct. 20, 2026

(54) IMAGE SENSOR INTEGRATED CHIP STRUCTURE

(71) Applicant: Taiwan Semiconductor Manufacturing Company, Ltd., Hsinchu (TW)

(72) Inventors: Chi-Hsien Chung, New Taipei City (TW); Tzu-Jui Wang, Fengshan City (TW); Chia-Chi Hsiao, Tianzhong Township (TW); Chen-Jong Wang, Hsin-Chu (TW); Dun-Nian Yaung, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 490 days.

(21) Appl. No.: 18/346,530

(22) Filed: Jul. 3, 2023

(65) Prior Publication Data

US 2024/0290811 A1 Aug. 29, 2024

Related U.S. Application Data

(60) Provisional application No. 63/486,728, filed on Feb. 24, 2023.

(51) Int. Cl.
*H10F 39/00* (2025.01)
*H04N 25/79* (2023.01)
*H10F 39/18* (2025.01)

(52) U.S. Cl.
CPC ........... *H10F 39/809* (2025.01); *H04N 25/79* (2023.01); *H10F 39/018* (2025.01);
(Continued)

(58) Field of Classification Search
CPC .... H10F 39/809; H10F 39/018; H10F 39/807; H04N 25/79
See application file for complete search history.

(56) References Cited

U.S. PATENT DOCUMENTS 8,629,524 B2 1/2014 Wang et al.
8,957,358 B2 2/2015 Wan et al.
(Continued)

OTHER PUBLICATIONS

U.S. Appl. No. 17/749,457, filed May 20, 2022.
(Continued)

*Primary Examiner* — Tucker J Wright
(74) *Attorney, Agent, or Firm* — Eschweiler & Potashnik, LLC

(57) ABSTRACT

The present disclosure relates to an image sensor integrated chip structure. The image sensor integrated chip structure includes one or more logic devices disposed within a first substrate and coupled to a first interconnect structure on the first substrate. A plurality of pixel support devices are disposed along a first-side of a second substrate and coupled to a second interconnect structure on the second substrate. The first substrate is bonded to the second substrate. A plurality of image sensing elements are disposed within a third substrate in pixel regions respectively including two or more of the plurality of image sensing elements. A plurality of transfer gates and a third interconnect structure are disposed on a first-side of the third substrate. The third interconnect structure includes interconnect wires and vias confined between the first-side of second substrate and the first-side of the third substrate.

20 Claims, 29 Drawing Sheets

(52) U.S. Cl.
CPC ......... *H10F 39/024* (2025.01); *H10F 39/182* (2025.01); *H10F 39/8053* (2025.01); *H10F 39/8063* (2025.01); *H10F 39/807* (2025.01); *H10F 39/811* (2025.01)

(56) References Cited

U.S. PATENT DOCUMENTS

| | | | | |
|---|---|---|---|---|
| 9,136,302 | B2 | 9/2015 | Wang et al. | |
| 10,090,349 | B2 | 10/2018 | Wan et al. | |
| 11,063,081 | B2 | 7/2021 | Sze et al. | |
| 2014/0042298 | A1 * | 2/2014 | Wan ...................... | H10F 39/809<br>257/E31.127 |
| 2015/0179691 | A1 * | 6/2015 | Yanagita ............... | H10F 39/811<br>257/292 |
| 2017/0104020 | A1 | 4/2017 | Lee et al. | |
| 2020/0105814 | A1 | 4/2020 | Hashiguchi et al. | |
| 2020/0135617 | A1 | 4/2020 | Shen et al. | |
| 2021/0104571 | A1 | 4/2021 | Shohji et al. | |
| 2022/0037388 | A1 * | 2/2022 | Takizawa .............. | H10F 39/199 |
| 2022/0336505 | A1 | 10/2022 | Kao et al. | |
| 2023/0282671 | A1 * | 9/2023 | Zang ................... | H10F 39/8057<br>257/432 |

OTHER PUBLICATIONS

U.S. Appl. No. 17/837,534, filed Jun. 10, 2022.
U.S. Appl. No. 17/845,624, filed Jun. 21, 2022.
Zaitsu et al. "A 2-Layer Transistor Pixel Stacked CMOS Image Sensor with Oxide-Based Full Trench Isolation for Large Full Well Capacity and High Quantum Efficiency" 2022 IEEE Symposium on VLSI Technology and Circuits (VLSI Technology and Circuits), published on Jul. 22, 2022.

* cited by examiner

3200

IMAGE SENSOR INTEGRATED CHIP STRUCTURE

REFERENCE TO RELATED APPLICATION

This application claims the benefit of U.S. Provisional Application No. 63/486,728, filed on Feb. 24, 2023, the contents of which are hereby incorporated by reference in their entirety.

BACKGROUND

Integrated circuits (IC) with image sensors are used in a wide range of modern-day electronic devices. In recent years, complementary metal-oxide semiconductor (CMOS) image sensors (CISs) have begun to see widespread use, largely replacing charge-coupled devices (CCD) image sensors. Compared to CCD image sensors, CISs are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
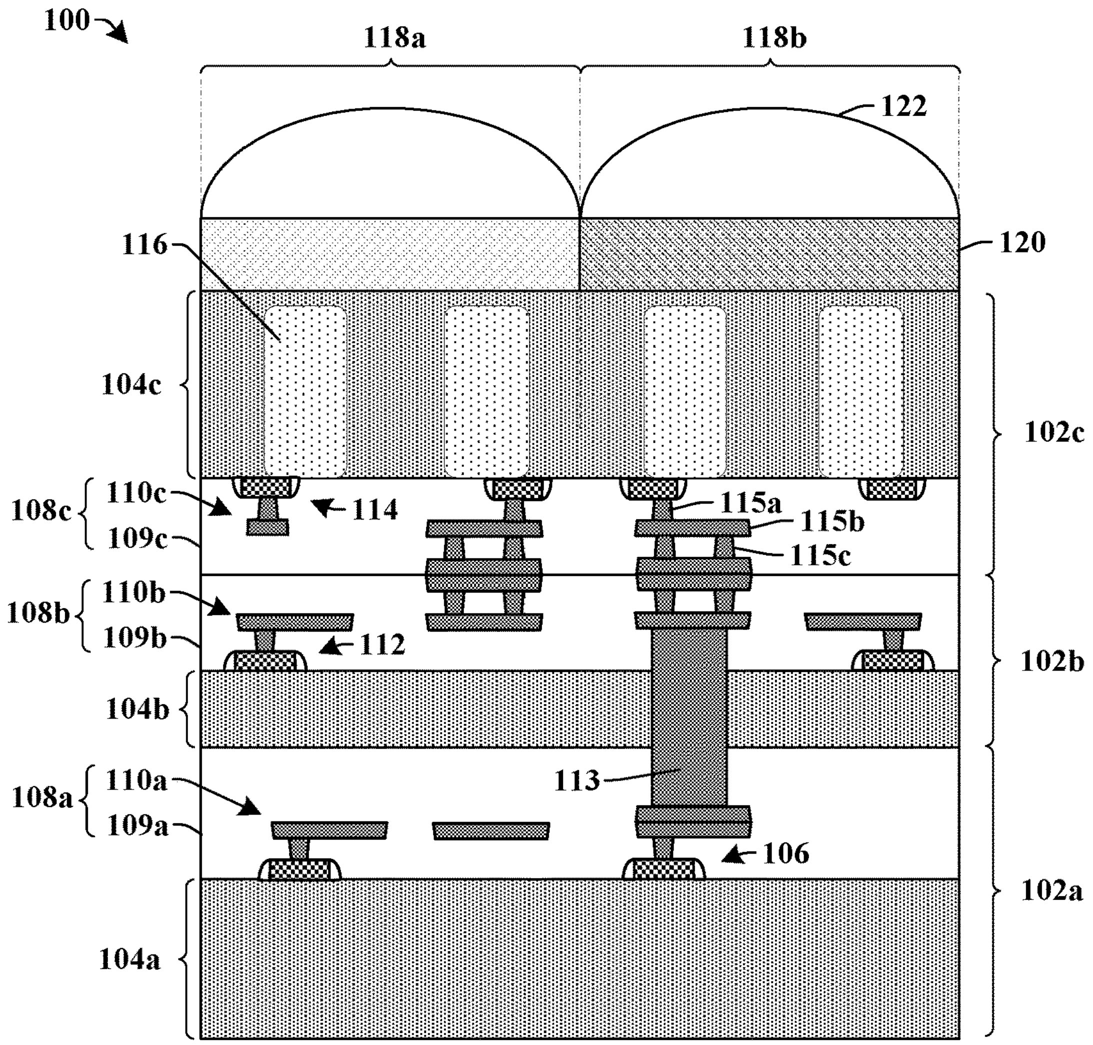
FIG. 1 illustrates a cross-sectional view of some embodiments of a disclosed image sensor integrated chip structure comprising separate integrated chip tiers including image sensing elements and pixel support devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Image sensor integrated chip structures (e.g., complementary metal-oxide semiconductor sensors (CISs)) typically include a plurality of photodiodes arranged in an array in rows and columns. To enable auto focus functionality, image sensor integrated chip structures may comprise dual-photodiode pixel regions that are configured to include a pair of photodiodes. For example, an array of micro-lenses may be disposed over an array of photodiodes so that respective micro-lenses in the array cover a pixel region including a pair of photodiodes. During operation, a convex module lens may be configured to focus incident radiation towards the image sensor integrated chip. If the incident radiation is in focus, the radiation will be evenly distributed between the pair of photodiodes. However, if the incident radiation is out of focus, one of the pair of photodiodes will receive more radiation than the other. Accordingly, the amount of charge can be read independently from the pair of photodiodes and used to change a focus (e.g., a position) of the convex module lens.

For years, the semiconductor industry has reduced sizes of pixel regions. Decreasing the sizes of pixel regions allows for a number of pixel regions in an image sensor integrated chip structure to be increased, thereby increasing a resolution of the image sensor integrated chip structure. However, as the sizes of pixel regions decrease a number of problems arise. For example, a full well capacity (FWC) of respective ones of the pixel regions decreases. The smaller FWC means that a photodiode will more quickly become saturated (e.g., no longer be able to detect to additional light) and a corresponding output signal will no longer be valid, thereby impacting a performance of the image sensor integrated chip (e.g., in bright light conditions). For dual-photodiode pixel regions, decreasing sizes of pixel regions can be especially harmful to device performance. This is because once a photodiode within a dual-photodiode pixel region becomes saturated, the amount of charge read from that photodiode is no longer accurate. Therefore, in addition to the photodiode providing poor performance in bright light conditions, a focus of a convex module lens may also be affected causing further degradation of performance of the image sensor integrated chip structure.

The present disclosure relates to an image sensor integrated chip structure that has image sensing elements (e.g., photodiodes) disposed on a different substrate than pixel support devices (e.g., reset transistors, source-follower transistors, row-select transistors, etc.). For example, in some embodiments the disclosed image sensor integrated chip may comprise a multi-dimensional integrated chip structure comprising a first substrate stacked onto a second substrate. The first substrate comprises a plurality of transfer gates and a plurality of image sensing elements arranged in pixel regions comprising two or more pixels. The second substrate comprises a plurality of pixel support devices. A first interconnect structure is on the first substrate and a second interconnect structure is on the second substrate. The plurality of pixel support devices are electrically coupled to the plurality of image sensing elements by way of the first and second interconnect structures. By having the image sensing elements disposed on a separate substrate than the plurality of pixel support devices, the pixel regions are able to be kept at a relatively large size (e.g., since space on the first substrate is not used for the pixel support devices) thereby improving performance (e.g., FWC) of the image sensor integrated chip structure. Furthermore, utilizing the first and second interconnect structures to couple the image sensing elements to the pixel support devices enables design freedom that can allow for different pixel configurations, thereby further improving performance of the image sensor integrated chip structure.

FIG. 1 illustrates a cross-sectional view of some embodiments of a disclosed image sensor integrated chip structure 100 comprising separate integrated chip tiers including image sensing elements and pixel support devices.

The image sensor integrated chip structure 100 comprises a plurality of integrated chip tiers 102*a*-102*c* stacked onto one another in a multi-dimensional integrated chip structure (e.g., a three-dimensional (3D) integrated chip structure). In some embodiments, the plurality of integrated chip tiers 102*a*-102*c* comprise a first integrated chip tier 102*a*, a second integrated chip tier 102*b*, and a third integrated chip tier 102*c*.

The first integrated chip tier 102*a* comprises a plurality of logic devices 106 disposed on and/or within a front-side of a first substrate 104*a*. In various embodiments, the plurality of logic devices 106 may comprise a planar FET, a FinFET, a gate all around FET (e.g., a nanosheet), and/or the like. A first interconnect structure 108*a* is disposed on the front-side of the first substrate 104*a*. The first interconnect structure 108*a* comprises a first plurality of interconnects 110*a* disposed within a first inter-level dielectric (ILD) structure 109*a*. The first plurality of interconnects 110*a* are electrically coupled to the plurality of logic devices 106.

The second integrated chip tier 102*b* comprises a plurality of pixel support devices 112 disposed on and/or within a front-side of a second substrate 104*b*. In some embodiments, the plurality of pixel support devices 112 may comprise a reset transistor, a source-follower transistor, and a row-select transistor. In some additional embodiments, the plurality of pixel support devices 112 may further comprise one or more transistors configured to operate as an analog-to-digital converter, an amplifier, a multiplexor, and/or the like. In various embodiments, the plurality of pixel support devices 112 may comprise a planar FET, a FinFET, a gate all around (GAA) transistor, a nanosheet transistor, or the like. A second interconnect structure 108*b* is disposed on the front-side of the second substrate 104*b*. The second interconnect structure 108*b* comprises a second plurality of interconnects 110*b* disposed within a second ILD structure 109*b*. In some embodiments, sizes (e.g., widths and/or heights) of the second plurality of interconnects 110*b* may monotonically increase as a distance from the second substrate 104*b* increases. The second plurality of interconnects 110*b* are electrically coupled to the plurality of pixel support devices 112. The second plurality of interconnects 110*b* are further electrically coupled to the first plurality of interconnects 110*a* by way of a through-substrate-via (TSV) 113.

The third integrated chip tier 102*c* comprises a plurality of image sensing elements 116 disposed within a third substrate 104*c*. The plurality of image sensing elements 116 are disposed within a plurality of pixel regions 118*a*-118*b*. In some embodiments, the plurality of pixel regions 118*a*-118*b* respectively include two or more image sensing elements 116 configured to convert electromagnetic radiation to an electric signal. For example, in some embodiments the plurality of pixel regions 118*a*-118*b* may respectively comprise two image sensing elements (e.g., two photodiodes) arranged in a dual-image sensing element configuration. Having two image sensing elements within each of the plurality of pixel regions 118*a*-118*b* enables the image sensor integrated chip structure 100 to have an auto focus functionality. In various embodiments, the plurality of image sensing elements 116 may comprise a photodiode, a phototransistor, or the like.

A plurality of transfer gates 114 are disposed on a front-side of the third substrate 104*c*. A third interconnect structure 108*c* is also disposed on the front-side of the third substrate 104*c*. The third interconnect structure 108*c* comprises a third plurality of interconnects 110*c* disposed within a third ILD structure 109*c*. The third interconnect structure 108*c* is bonded to the second interconnect structure 108*b* along a bonding interface comprising one or more conductive interfaces and one or more dielectric interfaces. The third plurality of interconnects 110*c* are electrically coupled to the plurality of transfer gates 114 and to the plurality of pixel support devices 112. The third plurality of interconnects 110*c* include conductive contacts 115*a*, interconnects wires 115*b*, and/or interconnect vias 115*c*. The interconnect wires 115*b* are configured to provide horizontal routing, while the conductive contacts 115*a* and interconnect vias 115*c* are configured to provide electrical connections between vertically adjacent ones of the interconnect wires 115*b*. In some embodiments, sizes (e.g., widths and/or heights) of the third plurality of interconnects 110*c* may monotonically increase as a distance from the third substrate 104*c* increases (so that a largest size of interconnects is separated from both the second substrate 104*b* and the third substrate 104*c* by additional layers of interconnects).

A plurality of color filters 120 are disposed on a back-side of the third substrate 104*c* and a plurality of micro-lenses 122 are arranged on the color filter 120. The plurality of micro-lenses 122 respectively and directly overlie image sensing elements within one of the plurality of pixels regions 118*a*-118*b*. For example, in some embodiments the plurality of micro-lenses 122 respectively and directly overlie two of the plurality of image sensing elements 116.

By having the plurality of pixel support devices 112 (e.g., reset transistors, source-follower transistors, row-select transistors, etc.) disposed on a separate substrate than the plurality of image sensing elements 116, the plurality of image sensing elements 116 may have a relatively large size. The relatively large size of the plurality of image sensing elements 116 improves performance of the image sensor integrated chip structure 100 by increasing a full well capacity (FWC) (e.g., an amount of charge that can be stored within an individual pixel without the pixel becoming saturated or no longer able to store any more charge) of the plurality of pixel regions 118*a*-118*b*. Furthermore, utilizing the second interconnect structure 108*b* and the third interconnect structure 108*c* to couple the image sensing elements 116 to the pixel support devices 112 enables design freedom that can allow for different pixel configurations, thereby further improving performance of the image sensor integrated chip structure 100.

Figure 2:
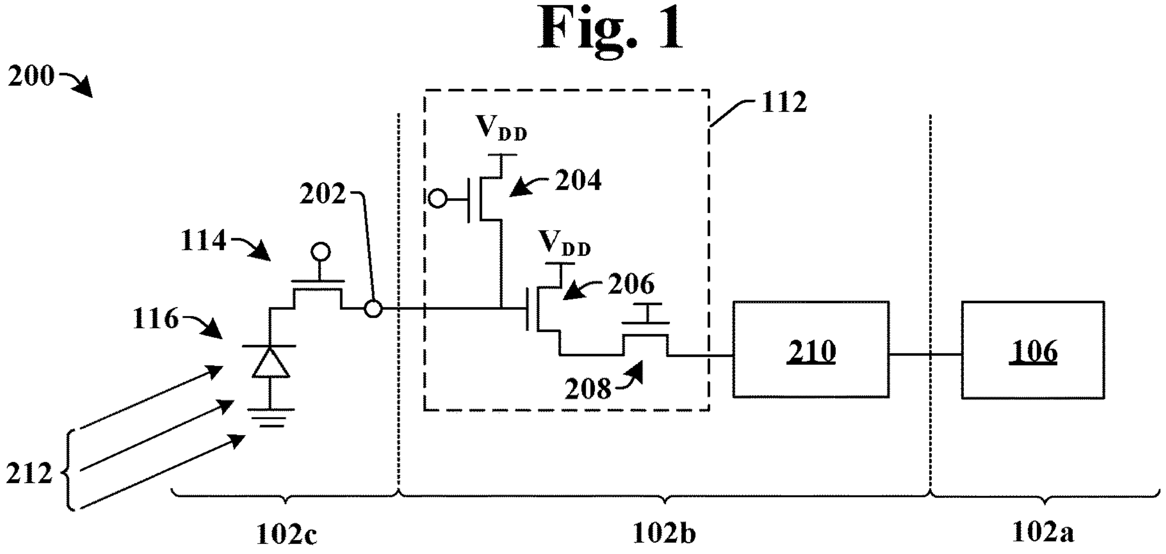
FIG. 2 illustrates a block diagram of some embodiments of a disclosed image sensor integrated chip structure comprising separate integrated chip tiers including image sensing elements and pixel support devices.

FIG. 2 illustrates a block diagram 200 of some embodiments of a disclosed image sensor integrated chip structure comprising separate integrated chip tiers including image sensing elements and pixel support devices.

As shown in block diagram 200, a first integrated chip tier 102*a* comprises one or more logic devices 106 (e.g., transistor devices). The one or more logic devices 106 may be configured to perform operations such as image processing, analog data processing (e.g., noise reduction, data sampling, etc.), or the like.

A second integrated chip tier 102*b* comprises a plurality of pixel support devices 112. In some embodiments, the plurality of pixel support devices 112 comprise a reset transistor 204, a source-follower transistor 206, and a row-select transistor 208. The reset transistor 204 comprises a source coupled to the floating diffusion region 202. The source-follower transistor 206 comprises a gate coupled to the floating diffusion region 202. The row-select transistor 208 is coupled to a drain of the source-follower transistor 206. In some embodiments, the second integrated chip tier 102*b* may further comprise one or more in-pixel devices 210 (e.g., comprising column amplifiers and/or capacitors 508, column decoders 510, analog to digital converters 512, and/or the like) coupled to the plurality of pixel support devices 112. The one or more in-pixel devices 210 are further coupled to the one or more logic devices 106 disposed within the third integrated chip tier 102*c*.

A third integrated chip tier 102*c* comprises a plurality of image sensing elements 116 (e.g., photodetectors) and a plurality of transfer gates 114. The plurality of transfer gates 114 are configured to selectively provide charges from the plurality of image sensing elements 116 to a floating diffusion region 202 disposed within the third integrated chip tier 102*c*. The floating diffusion region 202 is further coupled to the plurality of pixel support devices 112 in the second integrated chip tier 102*b*.

During operation, electromagnetic radiation 212 (e.g., photons) striking the plurality of image sensing elements 116 generates charge carriers, which are collected in the plurality of image sensing elements 116. When the plurality of transfer gates 114 are turned on, the charge carriers in the plurality of image sensing elements 116 are transferred to the floating diffusion region 202 as a result of a potential difference existing between the plurality of image sensing elements 116 and the floating diffusion region 202. The charges are converted to voltage signals by the source-follower transistor 206 and the row-select transistor 208 is used for addressing. Prior to charge transfer, the floating diffusion region 202 is set to a predetermined low charge state by turning on the reset transistor 204, which causes electrons in the floating diffusion region 202 to flow into a voltage source (VDD).

FIGS. 3A-3D illustrate some embodiments of a disclosed image sensor integrated chip structure comprising a horizontal dual-photodiode structure.

Figure 3A:
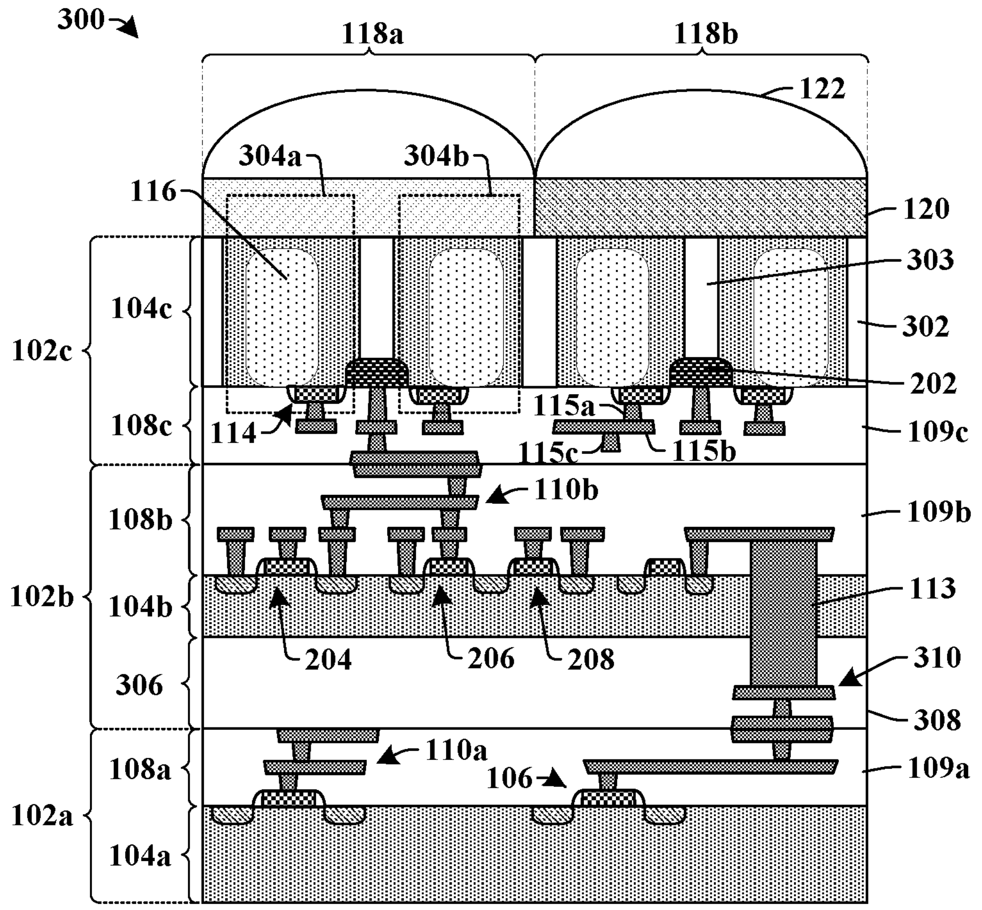
FIGS. 3A-3D illustrate some embodiments of a disclosed image sensor integrated chip structure comprising a horizontal dual-image sensing element configuration.

FIG. 3A illustrates a cross-sectional view 300 of some embodiments of the image sensor integrated chip structure comprising a horizontal dual-image sensing element configuration.

As shown in cross-sectional view 300, the image sensor integrated chip structure comprises a first integrated chip tier 102*a*, a second integrated chip tier 102*b* stacked onto the first integrated chip tier 102*a*, and a third integrated chip tier 102*c* stacked onto the second integrated chip tier 102*b*. In some embodiments, the first integrated chip tier 102*a* is bonded to the second integrated chip tier 102*b* by way of a first bonding interface comprising both dielectric and metal interfaces (e.g., interfaces between adjacent dielectrics and interfaces between adjacent metals). In some embodiments, the second integrated chip tier 102*b* is bonded to the third integrated chip tier 102*c* by way of a second bonding interface comprising both dielectric and metal interfaces.

The first integrated chip tier 102*a* comprises a plurality of logic devices 106 disposed on and/or within a first substrate 104*a*. A first interconnect structure 108*a* is disposed on the first substrate 104*a*.

The second integrated chip tier 102*b* comprises a plurality of pixel support devices disposed on and/or within a second substrate 104*b*. The plurality of pixel support devices include a reset transistor 204, a source-follower transistor 206, and a row-select transistor 208. A second interconnect structure 108*b* is disposed on a front-side of the second substrate 104*b*. In some embodiments, an additional interconnect structure 306 is disposed on a back-side of the second substrate 104*b*. The additional interconnect structure 306 surrounds a plurality of additional interconnects 310. In such embodiments, the first interconnect structure 108*a* is coupled to the additional interconnect structure 306 along the first bonding interface.

The third integrated chip tier 102*c* comprises a plurality of image sensing elements 116 disposed within a third substrate 104*c* and a plurality of transfer gates 114 arranged along a front-side of the third substrate 104*c*. The plurality of transfer gates 114 are configured to selectively transfer charges from the plurality of image sensing elements 116 to a floating diffusion region 202 arranged within the third substrate 104*c*.

The plurality of image sensing elements 116 are arranged within a plurality of pixel regions 118*a*-118*b*. An isolation structure 302 is arranged along opposing sides of the plurality of pixel regions 118*a*-118*b*. The isolation structure 302 may comprise one or more dielectric materials disposed within one or more trenches formed by sidewalls of the third substrate 104*c*. In some embodiments, the isolation structure 302 may comprise a back-side deep trench isolation (BS-DTI) structure comprising one or more dielectric materials disposed within one or more trenches extending into a back-side of the third substrate 104*c*. In some embodiments, the isolation structure 302 may extend completely through the third substrate 104*c*. By utilizing an isolation structure 302 comprising one or more dielectric materials rather than an implant isolation region, a full well capacity (FWC) of the disclosed image sensor integrated chip structure can be further improved since the isolation structure 302 can provide for a high level of electrical isolation over a smaller size than an implant isolation region.

In some embodiments, one or more additional isolation regions 303 may be disposed within the third substrate 104*c* over the floating diffusion region 202. In some such embodiments, the plurality of pixel regions 118*a*-118*b* may respectively comprise a plurality of image sensor regions 304*a*-304*b* separated from another by the one or more additional isolation regions 303. The plurality of image sensor regions 304*a*-304*b* respectively comprise one of the plurality of transfer gates 114 and one of the plurality of image sensing elements 116. The one or more additional isolation regions 303 extend partially through the third substrate 104*c*, so as to provide electrical isolation between adjacent ones of the plurality of image sensor regions 304*a*-304*b* while still allowing for the floating diffusion region 202 to be shared between adjacent ones of the plurality of image sensor regions 304*a*-304*b*.

A third interconnect structure 108*c* is disposed on the third substrate 104*c*. The plurality of transfer gates 114 are coupled to the reset transistor 204 and the source-follower transistor 206 by way of the second interconnect structure 108*b* and the third interconnect structure 108*c*. The third interconnect structure 108*c* comprises conductive contacts 115*a*, interconnect wires 115*b*, and interconnect vias 115*c*. The conductive contacts 115*a* are configured to couple the interconnect wires 115*b* to the plurality of transfer gates 114 and to the floating diffusion region 202. The interconnect wires 115*b* may extend laterally past one or more outermost sidewalls of the conductive contacts 115*a* and/or the interconnect vias 115*c*.

A plurality of micro-lenses 122 are disposed over the plurality of pixel regions 118*a*-118*b*. In some embodiments, the plurality of micro-lenses 122 may respectively be disposed over two of the plurality of image sensor regions 304*a*-304*b*.

Figure 3B:
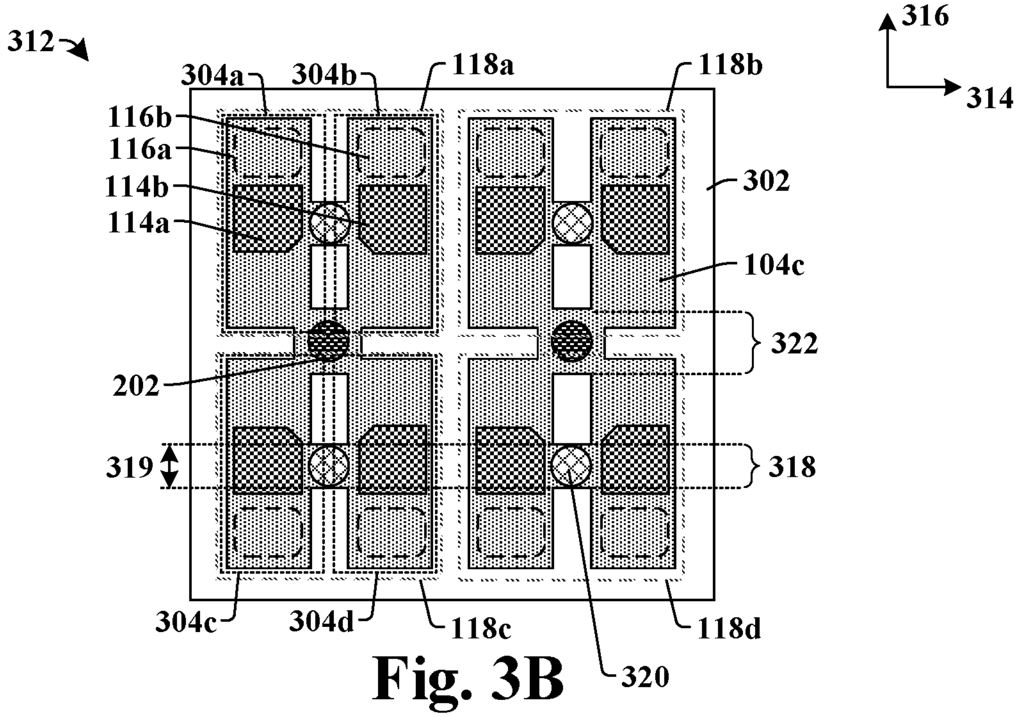

FIG. 3B illustrates some embodiments of a top-view 312 of the disclosed image sensor integrated chip structure of FIG. 3A.

As shown in top-view 312, the plurality of pixel regions 118*a*-118*d* are arranged in the third substrate 104*c* in rows and columns. The rows extend in a first direction 314 and the columns extend in a second direction 316 that is perpendicular to the first direction 314. The isolation structure 302 is arranged along opposing sides of the plurality of pixel regions 118*a*-118*d*. In some embodiments, the isolation structure 302 surrounds the plurality of pixel regions 118*a*-118*d* along the first direction 314 and the second direction 316. In some embodiments, the isolation structure 302 continuously wraps around multiple sides of respective ones of the plurality of pixel regions 118*a*-118*d* as viewed in the top-view. In some embodiments, the isolation structure 302 may wrap around two or more of the plurality of pixel regions 118*a*-118*d* in a closed and unbroken loop.

In some embodiments, the isolation structure 302 comprises sidewalls that face one another to form a first opening 318 extending between the adjacent ones of the plurality of image sensor regions 304*a*-304*d*. In such embodiments, a front-side of the third substrate 104*c* continuously extends from directly over a first image sensing element 116*a* to directly over a second image sensing element 116*b*. In some embodiments, the first opening 318 may have a width 319 that is in a range of between approximately 1 micron (μm) and approximately 10 μm, between approximately 2 μm and approximately 7 μm, or other similar values.

In some embodiments, a doped well region 320 is disposed within the first opening 318 in the isolation structure 302. In some embodiments, the doped well region 320 may comprise a pick-up region (e.g., a p+ pick-up region configured to provide a ground connection to the third substrate 104*c*) that provides charges within a pixel region an overflow path that is configured mitigate blooming with the pixel region. By having the doped well region 320 disposed within the first opening 318 in the isolation structure 302, a size of the image sensing elements 116*a*-116*b* may be larger, thereby further increasing a FWC of the image sensor integrated chip structure.

In some embodiments, the isolation structure 302 may further comprise a second opening 322 that extends between adjacent ones of the plurality of image sensor regions 304*a*-304*d*. In some embodiments, the second opening 322 is located at corners of four neighboring image sensor regions 304*a*-304*d*. In some embodiments, a floating diffusion region 202 is arranged within the second opening 322. In such embodiments, the neighboring image sensor regions 304*a*-304*d* may share the floating diffusion region 202 (e.g., so that multiple image sensor regions share a single floating diffusion region). By having the floating diffusion region 202 disposed within the second opening 322 in the isolation structure 302, a size of the image sensing elements 116*a*-116*b* may be larger, thereby further increasing a FWC of the image sensor integrated chip structure. Furthermore, by sharing the floating diffusion region 202 between neighboring image sensor regions 304*a*-304*d*, a capacitance of the floating diffusion region 202 can be decreased (e.g., since there is only one junction between the floating diffusion region 202 and surrounding substrate that contributes to floating diffusion region capacitance rather than multiple), thereby reducing noise and increasing a gain of the image sensor integrated chip structure.

Figure 3C:
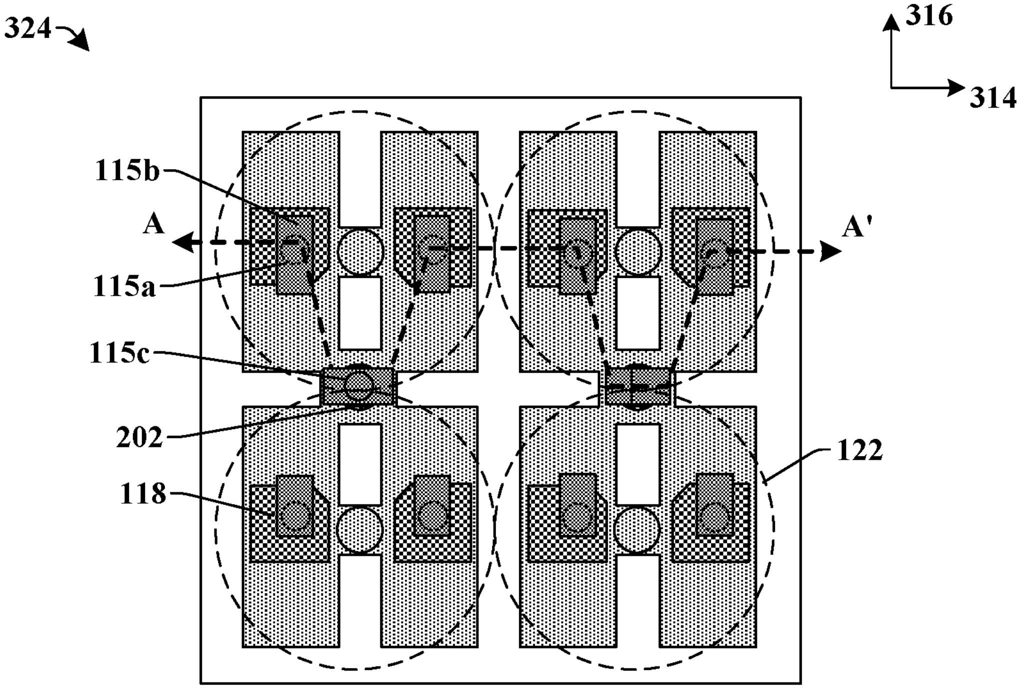

FIG. 3C illustrates some embodiments of an additional top-view 324 of the disclosed image sensor integrated chip structure of FIG. 3A illustrating interconnects. In some embodiments, FIG. 3A is taken along cross-sectional line A-A' of FIG. 3C.

As shown in additional top-view 324, the third interconnect structure comprises conductive contacts 115*a*, interconnect wires 115*b*, and interconnect vias 115*c*. The conductive contacts 115*a* are configured to couple the interconnect wires 115*b* to the plurality of transfer gates 114 and to the floating diffusion region 202. The interconnect wires 115*b* may extend laterally past one or more outermost sidewalls of the conductive contacts 115*a* and/or the interconnect vias 115*c*. The plurality of micro-lenses 122 are disposed over the plurality of pixel regions 118*a*-118*d*.

Figure 3D:
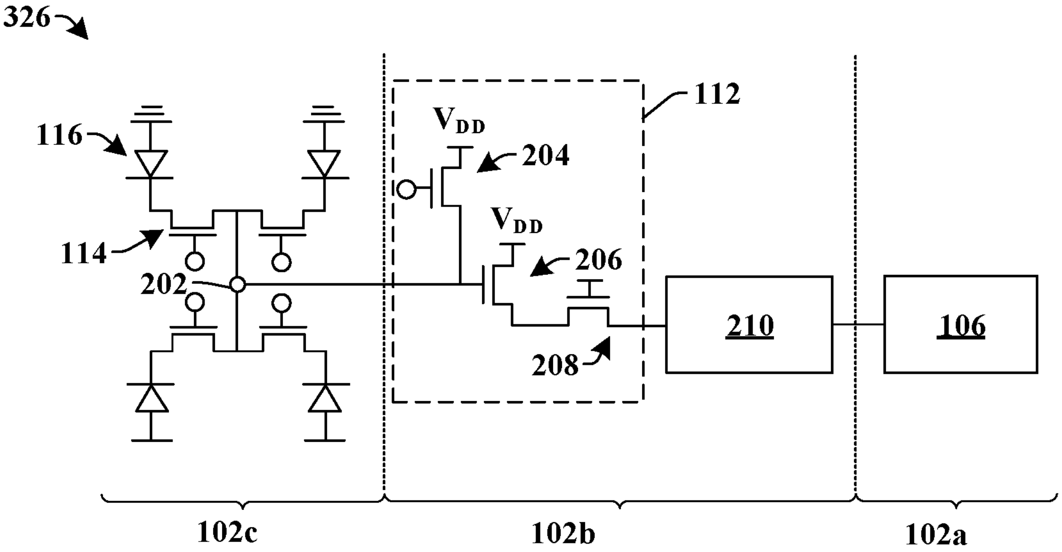

FIG. 3D illustrates a block diagram 326 of some embodiments of the image sensor integrated chip structure shown in FIGS. 3A-3C.

Figure 4A:
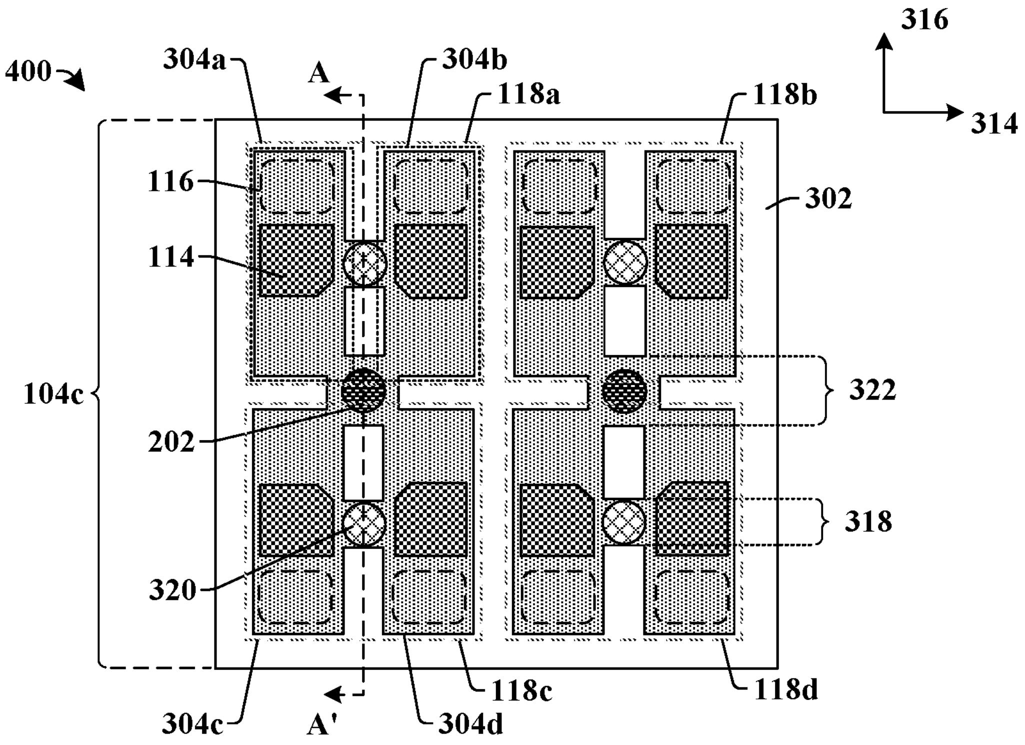
FIGS. 4A-4C illustrate some additional embodiments of a disclosed image sensor integrated chip structure comprising a horizontal dual-image sensing element configuration.

FIG. 4A illustrates a top-view 400 of some additional embodiments of a disclosed image sensor integrated chip structure comprising a horizontal dual-image sensing element configuration.

As shown in top-view 400, a plurality of pixel regions 118*a*-118*d* are arranged in the third substrate 104*c* in rows and columns. The plurality of pixel regions 118*a*-118*d* respectively comprise a plurality of transfer gates 114 and a plurality of image sensing elements 116. An isolation structure 302 is arranged within the third substrate 104*c* and may wrap around two or more of the plurality of pixel regions 118*a*-118*d* in a closed and unbroken loop. The isolation structure 302 comprises a first opening 318 extending between adjacent image sensor regions, 304*a* and 304*b*. A doped well region 320 is disposed within the first opening 318 in the isolation structure 302. In some embodiments, the isolation structure 302 may alternatively and/or additionally comprise a second opening 322 extending between adjacent ones of the plurality of image sensor regions 304a-304d. A floating diffusion region 202 is disposed within the second opening 322 in the isolation structure 302.

Figure 4B:
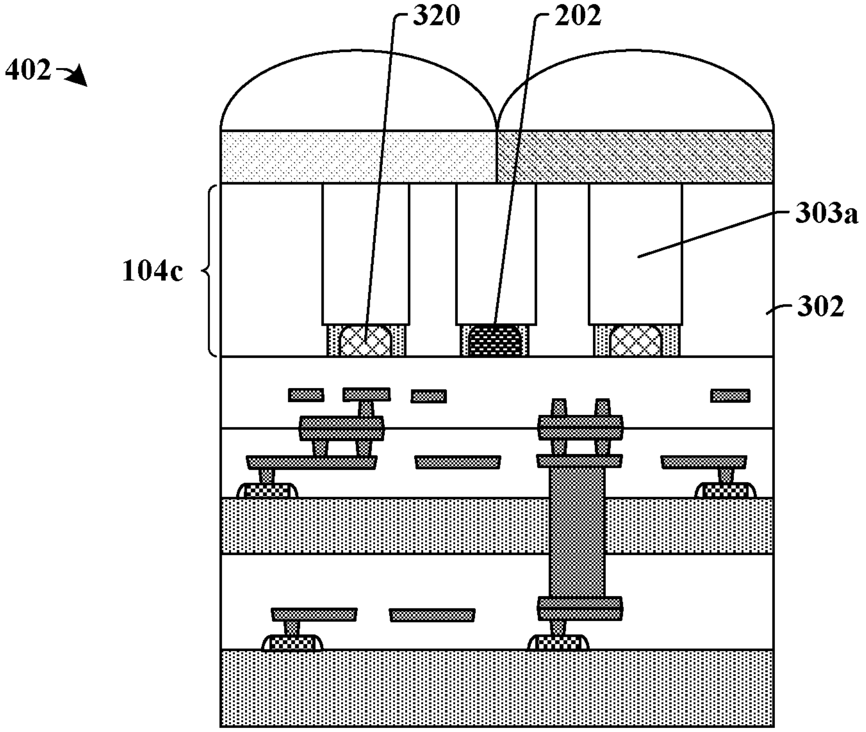

FIG. 4B illustrates a cross-sectional view 402 of some embodiments of the image sensor integrated chip structure taken along line A-A' of FIG. 4A.

As shown in cross-sectional view 402, the isolation structure 302 comprises one or more dielectric materials that are disposed within one or more trenches that continuously extend through the third substrate 104c. The isolation structure 302 comprises sidewalls that are arranged along opposing sides of the floating diffusion region 202 and on opposing sides of the doped well region 320. In some embodiments, the sidewalls of the isolation structure 302 are separated from the floating diffusion region 202 and the doped well region 320 by regions of the third substrate 104c that have smaller doping concentration (e.g., that are intrinsically doped or undoped).

One or more additional isolation regions 303a are arranged over the floating diffusion region 202 and the doped well region 320. The one or more additional isolation regions 303a comprise one or more dielectric materials disposed within one or more additional trenches that continuously extend partway, but not all the way, through the third substrate 104c. In other words, the one or more additional isolation regions 303a have a smaller height than a thickness of the third substrate 104c.

Figure 4C:
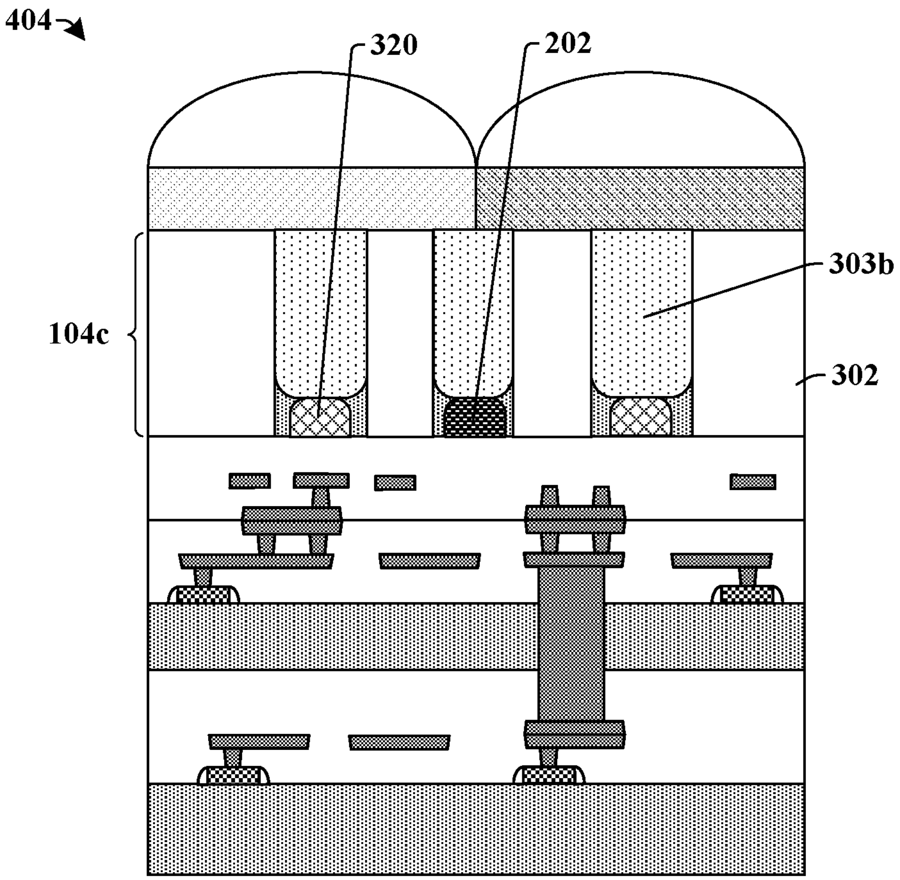

FIG. 4C illustrates a cross-sectional view 404 of some alternative embodiments of the image sensor integrated chip structure taken along line A-A' of FIG. 4A.

As shown in cross-sectional view 404, one or more additional isolation regions 303b are arranged over the floating diffusion region 202 and the doped well region 320. The one or more additional isolation regions 303b comprise an implant isolation region arranged in the third substrate 104c between sidewalls of the isolation structure 302. The one or more additional isolation regions 303b extend a part way, but not all the way through the third substrate 104c.

It will be appreciated that the use of the third interconnect structure to connect transfer gates and/or floating diffusion regions on the third substrate to pixel support devices on a second substrate enables a wide range of design freedom in a layout of a disclosed image sensor integrated chip structure. The design freedom can allow for the image sensors within pixel regions to be read at different times and/or in different orders (e.g., when using a rolling shutter scheme). Reading the image sensors within pixel regions at different times and/or in different orders can modify performance of the image sensor. FIGS. 5A-7D illustrate some embodiments of disclosed image sensor integrated chip structure that have different example layouts.

Figure 5A:
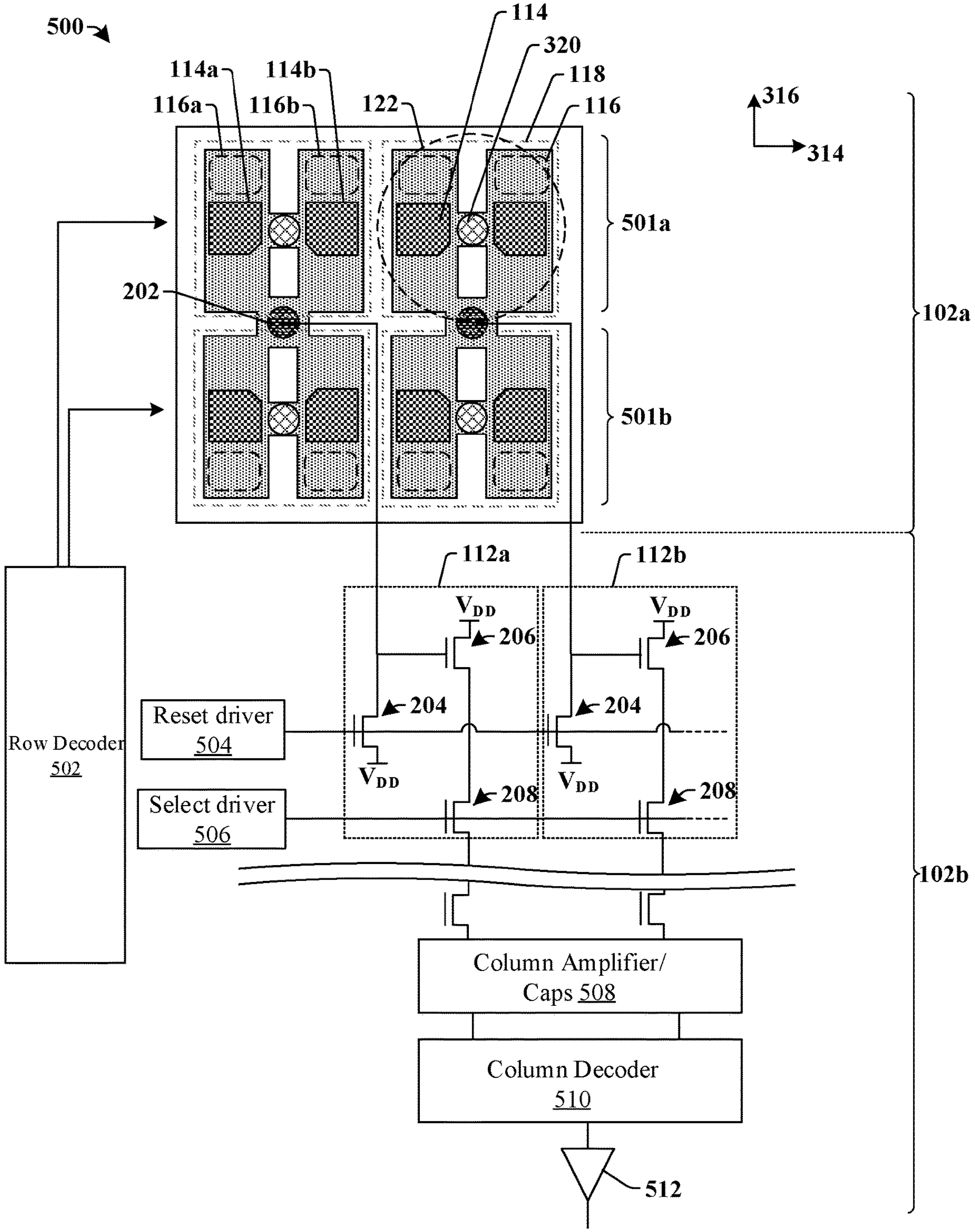
FIGS. 5A-5B illustrate some additional embodiments of a disclosed image sensor integrated chip structure comprising horizontal dual-image sensing element configurations.

FIG. 5A illustrates a top-view 500 of some embodiments of a disclosed image sensor integrated chip structure comprising an array of image sensing elements disposed in a horizontal dual-image sensing element configuration.

As shown in top-view 500, the disclosed image sensor integrated chip structure includes a plurality of pixel regions 118 comprising a plurality of transfer gates 114 and a plurality of image sensing elements 116. The plurality of pixel regions 118 respectively comprise a pair of image sensing elements 116a-116b (e.g., photodiodes) and a pair of transfer gates 114a-114b. The plurality of image sensing elements 116 within the plurality of pixel regions 118 are arranged in rows 501a-501b extending along a first direction 314 and columns extending along a second direction 316. Within respective ones of the plurality of pixel regions 118, the pair of image sensing elements 116a-116b are arranged next to each other along the first direction 314 (e.g., a 'horizontal' direction) that runs along in a direction of a row that is read out prior to an adjacent row. In some embodiments, a color filter and/or micro-lens 122 may cover respective ones of plurality of pixel regions 118.

The pair of image sensing elements 116a-116b within respective ones of the plurality of pixel regions 118 are coupled to pixel support circuitry disposed within a second integrated chip tier 102b of a multi-dimensional integrated chip device. The pixel support circuitry may comprise a row decoder 502, pixel support devices 112a-112b, a reset driver 504, a select driver 506, column amplifiers and/or capacitors 508, column decoders 510 (e.g., multiplexors), analog to digital converters 512, and/or the like.

The row decoder 502 is coupled to the plurality of transfer gates 114 using a plurality of interconnects that enable the plurality of image sensing elements 116 to be read on a row-by-row basis. For example, the plurality of image sensing elements 116 within a first row 501a are read prior to the plurality of image sensing elements 116 in a second row 501b. Using a plurality of interconnects to enable the plurality of image sensing elements 116 to be read on a row-by-row basis allows for both the pair of image sensing elements within a pixel region to be read during reading of a same row. In some embodiments, plurality of interconnects that enable the plurality of image sensing elements 116 to be read on a row-by-row basis allows for the pair of transfer gates that are separated by a doped well region 320 to be activated immediately after one another.

Figure 5B:
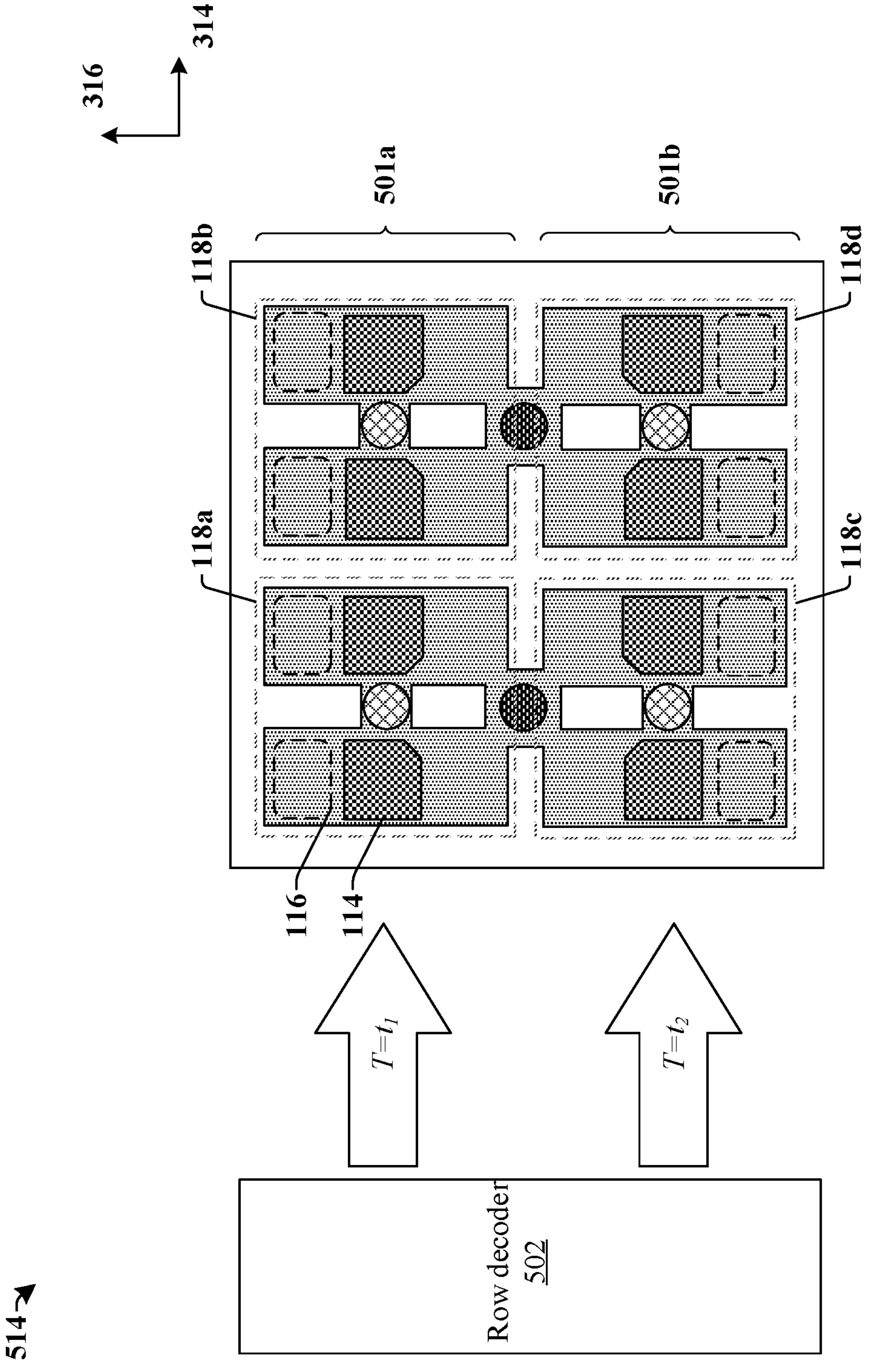

FIG. 5B illustrates a top-view 514 of some embodiments of a read sequence of the disclosed image sensor integrated chip structure of FIG. 5A. As shown in top-view 514, the array of the plurality of image sensing elements 116 is read on a row-by-row basis, during which the plurality of transfer gates 114 within a first row 501a are activated during a first time period $T=t_1$ that is prior to activating the plurality of transfer gates 114 within a second row 501b during a second time period $T=t_2$. By reading the plurality of image sensing elements 116 on a row-by-row basis, both of a pair of transfer gates within a first pixel region are activated (e.g., during reading of a row) during the first time period T=ty that is prior to activating both of a pair of transfer gates within a different, second pixel region during the second time period $T=t_2$. Allowing for both of a pair of transfer gates within a first pixel region to be activated read during reading of a row causes the readout time of the image sensing elements within the first pixel region to be substantially the same.

Figure 6A:
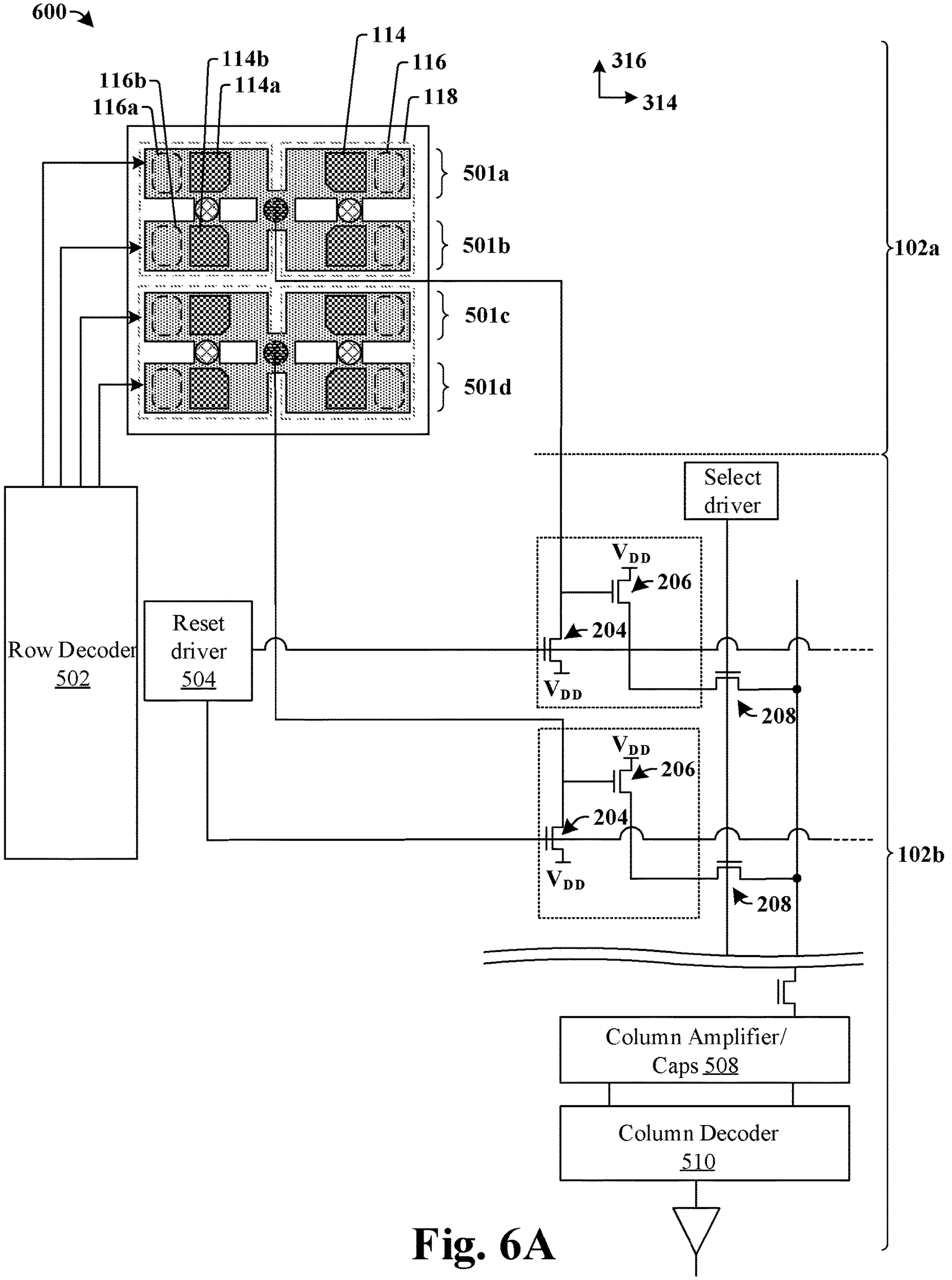
FIGS. 6A-6B illustrate some additional embodiments of a disclosed image sensor integrated chip structure comprising vertical dual-image sensing element configurations.

FIG. 6A illustrates a top-view 600 of some embodiments of a disclosed image sensor integrated chip structure comprising an array of image sensing elements disposed in a vertical dual-image sensing element configuration.

As shown in top-view 600, the disclosed image sensor integrated chip structure includes a plurality of pixel regions 118 comprising a plurality of transfer gates 114 and a plurality of image sensing elements 116. The plurality of pixel regions 118 respectively comprise a pair of transfer gates 114a-114b and a pair of image sensing elements 116a-116b arranged next to each other along the second direction 316 (e.g., a 'vertical direction) that runs perpendicular to a direction of a row that is read out prior to an adjacent row. The plurality of image sensing elements 116 within the plurality of pixel regions 118 are arranged in rows 501a-501d extending along a first direction 314 and columns extending along a second direction 316.

The pair of image sensing elements 116 within respective ones of the plurality of pixel regions 118 are coupled to pixel support circuitry disposed within a second integrated chip tier 102*b* of a multi-dimensional integrated chip device. The pixel support circuitry comprises a row decoder 502 coupled to the plurality of transfer gates 114 using a plurality of interconnects that enable the image sensing elements 116 to be read on a row-by-row basis. Using a plurality of interconnects to enable the image sensing elements 116 to be read on a row-by-row basis allows for a first one of the pair of image sensing elements within a pixel region to be read during reading of a first row 501*a*, while a second one of the pair of image sensing elements within the pixel region is read during reading of a second row 501*b*.

Figure 6B:
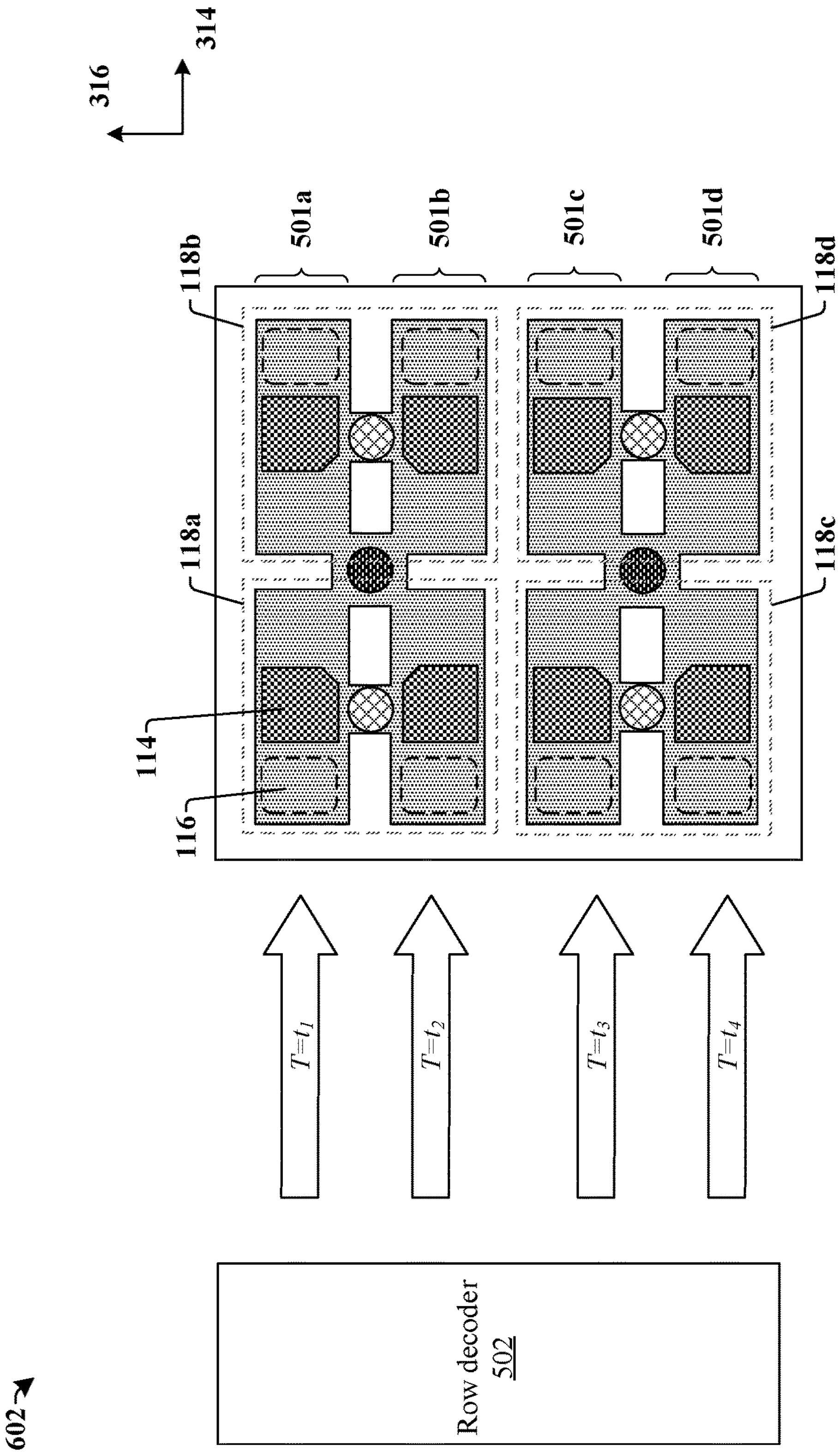

FIG. 6B illustrates a top-view 602 of some embodiments of a disclosed image sensor integrated chip structure comprising an array of image sensing elements disposed in a vertical dual-image sensing element configuration.

As shown in top-view 602 of some embodiments of a read sequence of the disclosed image sensor integrated chip structure of FIG. 6A. As shown in top-view 602, the array of image sensing elements is read on a row-by-row basis, during which the plurality of transfer gates 114 within a first row 501*a* are activated during a first time period $T=t_1$, the plurality of transfer gates 114 within a second row 501*b* are activated during a second time period $T=t_2$ after the first time period $T=t_1$, the plurality of transfer gates 114 within a third row 501*c* are activated during a third time period $T=t_3$ after the second time period $T=t_2$, and the plurality of transfer gates 114 within a fourth row 501*d* are activated during a fourth time period $T=t_4$ after the third time period $T=t_3$. By reading the plurality of image sensing elements 116 on a row-by-row basis, a first one of a pair of transfer gates within a pixel region is activated during a first time period $T=t_1$ (e.g., during reading of a first row) that is prior to activating a second one of the pair of transfer gates within the pixel region during a second time period $T=t_2$ (e.g., during reading of a second row).

FIGS. 7A-7D illustrate various embodiments of top-views of some embodiments of disclosed image sensor integrated chip structures comprising an array of image sensing elements disposed in asymmetric dual-image sensing element configurations.

Figure 7A:
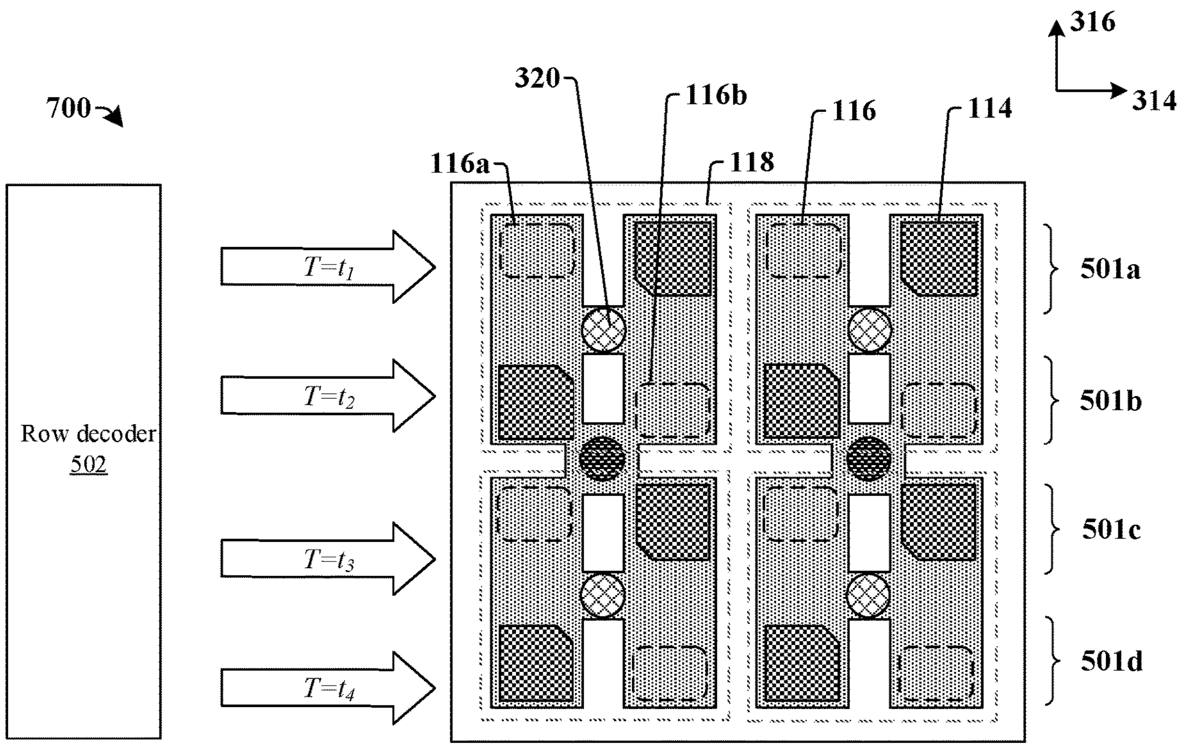
FIGS. 7A-7D illustrate some additional embodiments of disclosed image sensor integrated chip structures comprising asymmetric dual-image sensing element configurations.

FIG. 7A illustrates a top-view 700 of some embodiments of a disclosed image sensor integrated chip structure comprising an array of image sensing elements disposed in an asymmetric vertical dual-image sensing element configuration.

As shown in top-view 700, the image sensor integrated chip structure comprises a plurality of pixels regions 118 comprising a plurality of transfer gates 114 and a plurality of image sensing elements 116. In some embodiments, one or more of the plurality of transfer gates 114 may comprise a vertical transfer gate. Within respective ones of the plurality of pixel regions 118, a pair of image sensing elements 116*a*-116*b* are arranged next to each other along a first direction 314 (e.g., a 'horizontal' direction) that is parallel to a direction of a row that is read out prior to an adjacent row. The pair of image sensing elements 116*a*-116*b* are laterally offset from one another along a second direction 316 that is parallel to the first direction 314, so that the pair of image sensing elements 116*a*-116*b* are asymmetric about vertical and horizontal lines bisecting a doped well region 320.

Having the pair of image sensing elements 116*a*-116*b* asymmetric about vertical and horizontal lines bisecting the doped well region 320, allows for a larger space between the plurality of transfer gates 114 and/or interconnect wires coupled to the plurality of transfer gates 114. Having a larger space between the plurality of transfer gates 114 and/or interconnect wires coupled to the plurality of transfer gates 114, decreases a parasitic capacitance between the plurality of transfer gates 114 and/or interconnect wires. It also provides for more space to enable routing, thereby giving more design freedom.

Figure 7B:
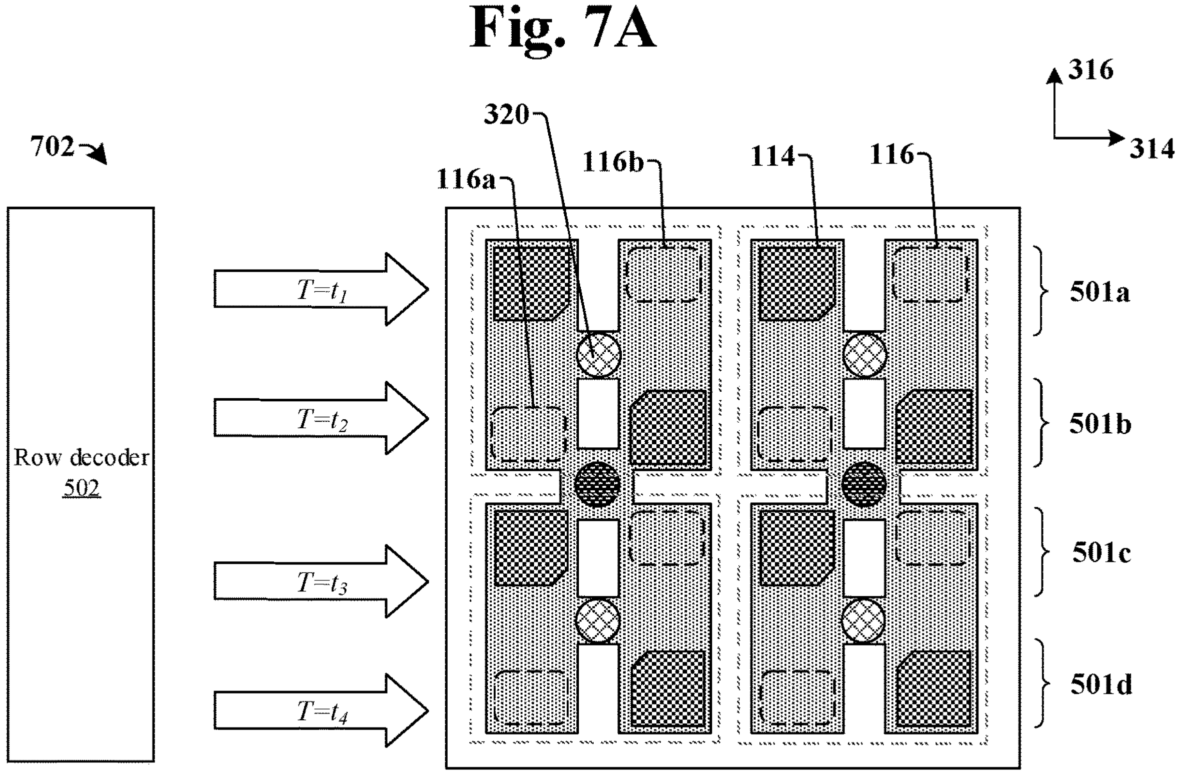

FIG. 7B illustrates a top-view 702 of some additional embodiments of a disclosed image sensor integrated chip structure comprising an array of image sensing elements disposed in a vertical dual-image sensing element configuration.

As shown in top-view 702, within respective ones of the plurality of pixel regions 118, a pair of image sensing elements 116*a*-116*b* are arranged next to each other along a first direction 314 (e.g., a 'horizontal' direction) that is parallel to a direction of a row that is read out prior to an adjacent row. The pair of image sensing elements 116*a*-116*b* are laterally offset from one another along a second direction 316 that is parallel to the first direction 314, so that the pair of image sensing elements 116*a*-116*b* are asymmetric about vertical and horizontal lines bisecting a doped well region 320.

Figure 7C:
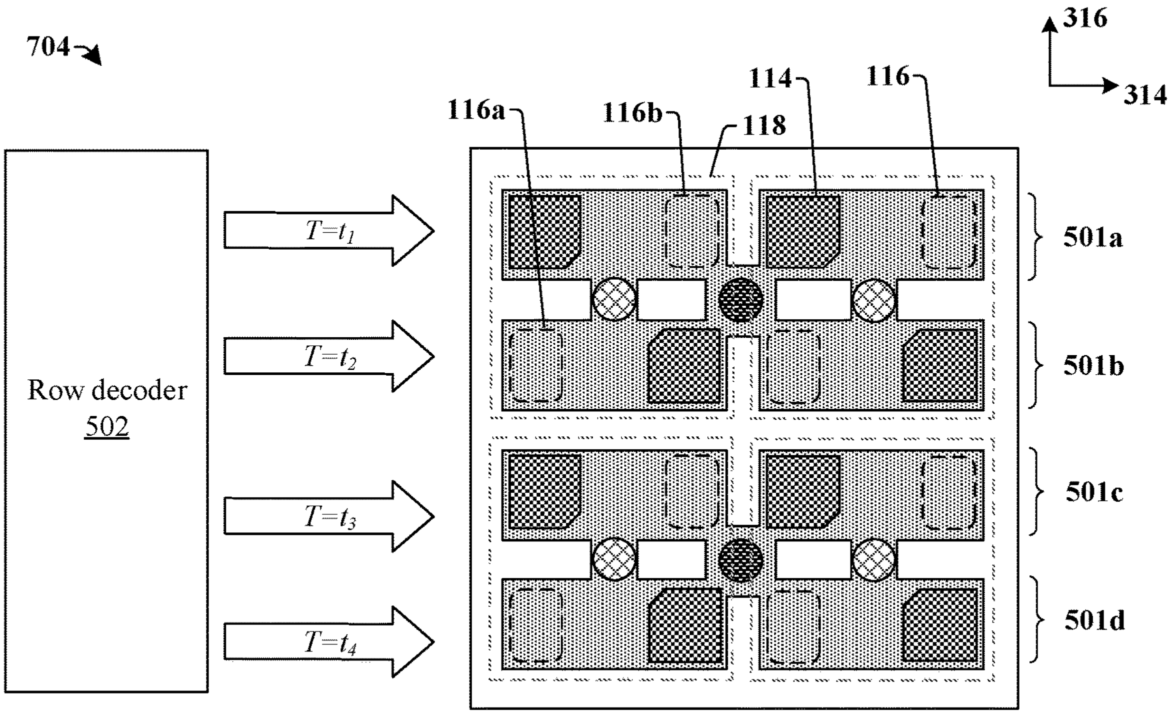

FIG. 7C illustrates a top-view 704 of some embodiments of a disclosed image sensor integrated chip structure comprising an array of image sensing elements disposed in a horizontal dual-image sensing element configuration.

As shown in top-view 704, within respective ones of the plurality of pixel regions 118, a pair of image sensing elements 116*a*-116*b* are arranged next to each other along the second direction 316 (e.g., a 'vertical' direction) that runs perpendicular to a direction of a row that is read out prior to an adjacent row. The pair of image sensing elements 116*a*-116*b* are laterally offset from one another along a first direction 314 that is parallel to a direction of the row that is read out.

Figure 7D:
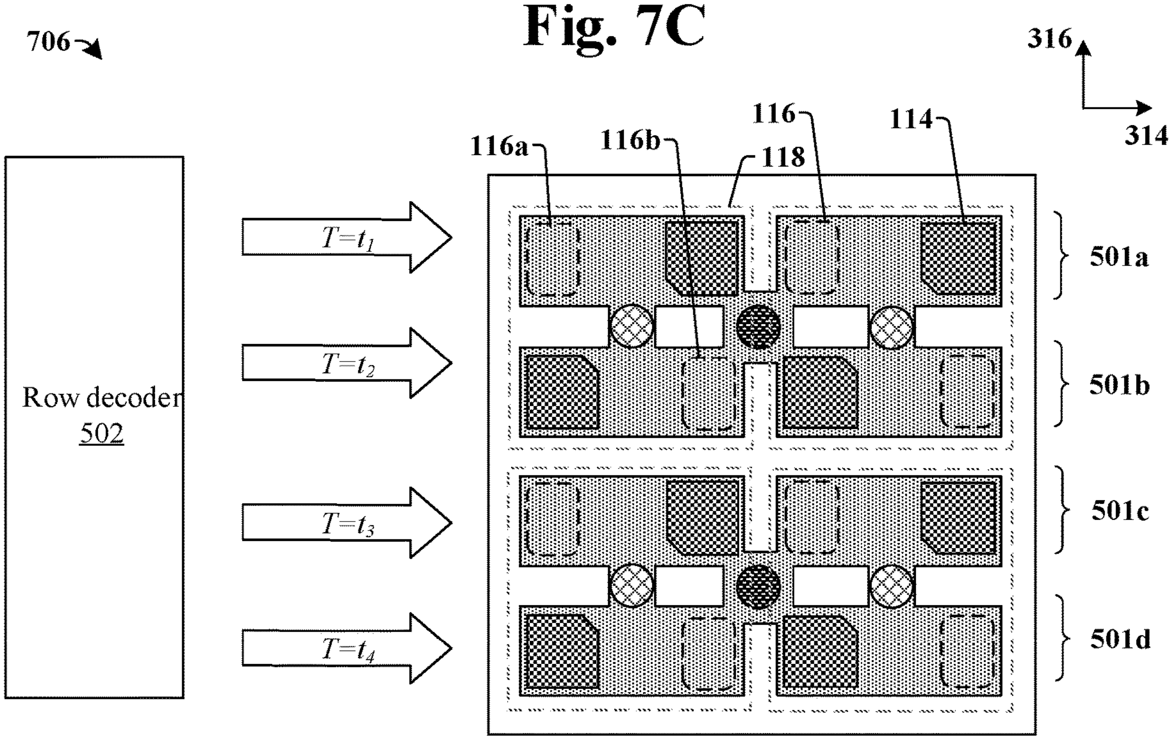

FIG. 7D illustrates a top-view 706 of some additional embodiments of a disclosed image sensor integrated chip structure comprising an array of image sensing elements disposed in a vertical dual-image sensing element configuration.

As shown in top-view 706, within respective ones of the plurality of pixel regions 118, the pair of image sensing elements 116*a*-116*b* are arranged next to each other along the second direction 316 (e.g., a 'vertical' direction) that runs perpendicular to a direction of a row that is read out prior to an adjacent row. The pair of image sensing elements 116*a*-116*b* are laterally offset from one another along a first direction 314 that is parallel to a direction of the row that is read out.

Figure 8A:
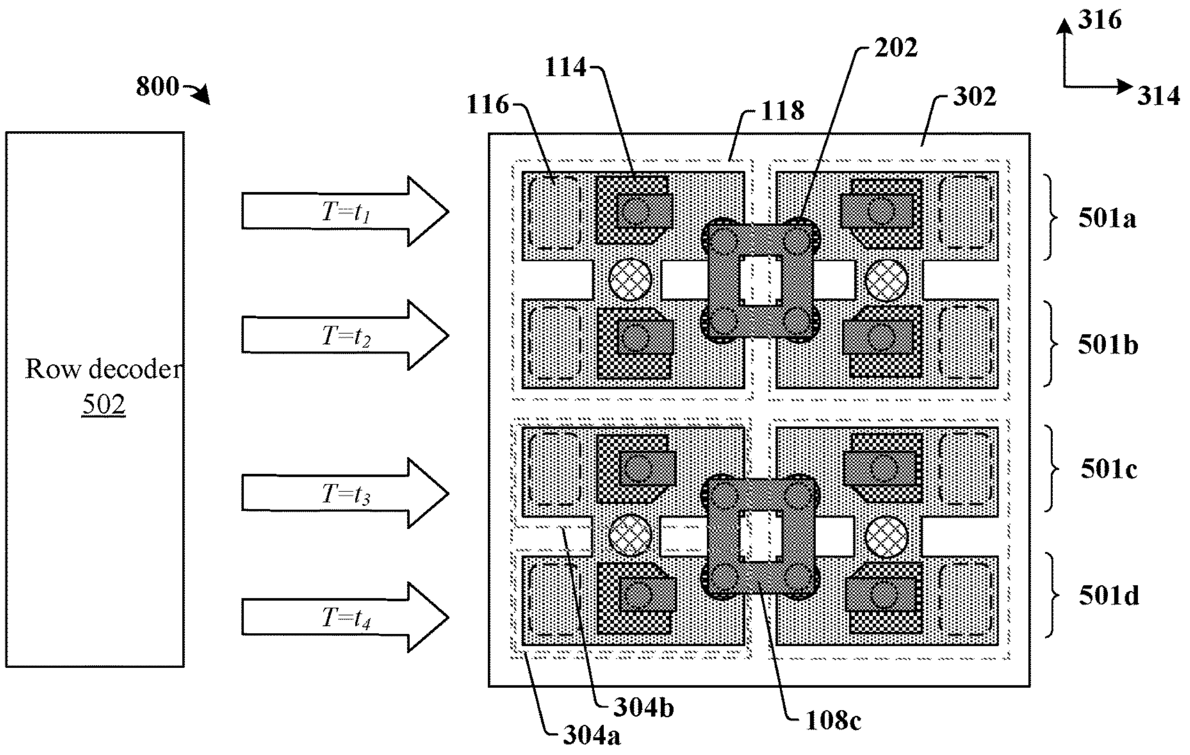
FIGS. 8A-8C illustrate some additional embodiments of disclosed image sensor integrated chip structures comprising dual-image sensing element configurations having floating diffusion regions shared through an interconnect structure.

FIG. 8A illustrates a cross-sectional view 800 of some additional embodiments of a disclosed image sensor integrated chip structure comprising an array of image sensing elements disposed in a vertical dual-image sensing element configuration.

As shown in cross-sectional view 800, the array comprises a plurality of image sensing elements 116 disposed within a plurality of image sensor regions 304*a*-304*b* of a plurality of pixel regions 118. An isolation structure 302 wraps around respective ones of the plurality of pixel regions 118 in a closed path. Within respective ones of the plurality of pixel regions 118, the plurality of image sensing elements 116 are arranged next to each other along the second direction 316 (e.g., a 'vertical' direction) that runs perpendicular to a direction of a row that is read out prior to an adjacent row. Within respective ones of the plurality of image sensor regions 304*a*-304*b*, a transfer gate 114 is configured to selectively control the flow of charge carriers from an image sensing element 116 to a floating diffusion region 202. The isolation structure 302 is directly between the floating diffusion region 202 within adjacent ones of the plurality of pixel regions 118.

A third interconnect structure 108*c* is disposed on the third substrate 104*c*. The third interconnect structure 108*c* is configured to couple the floating diffusion region 202 within adjacent ones of the plurality of pixel regions 118 together and to a reset transistor and a source-follower transistor on a separate substrate by way of the third interconnect structure 108*c*.

Figure 8B:
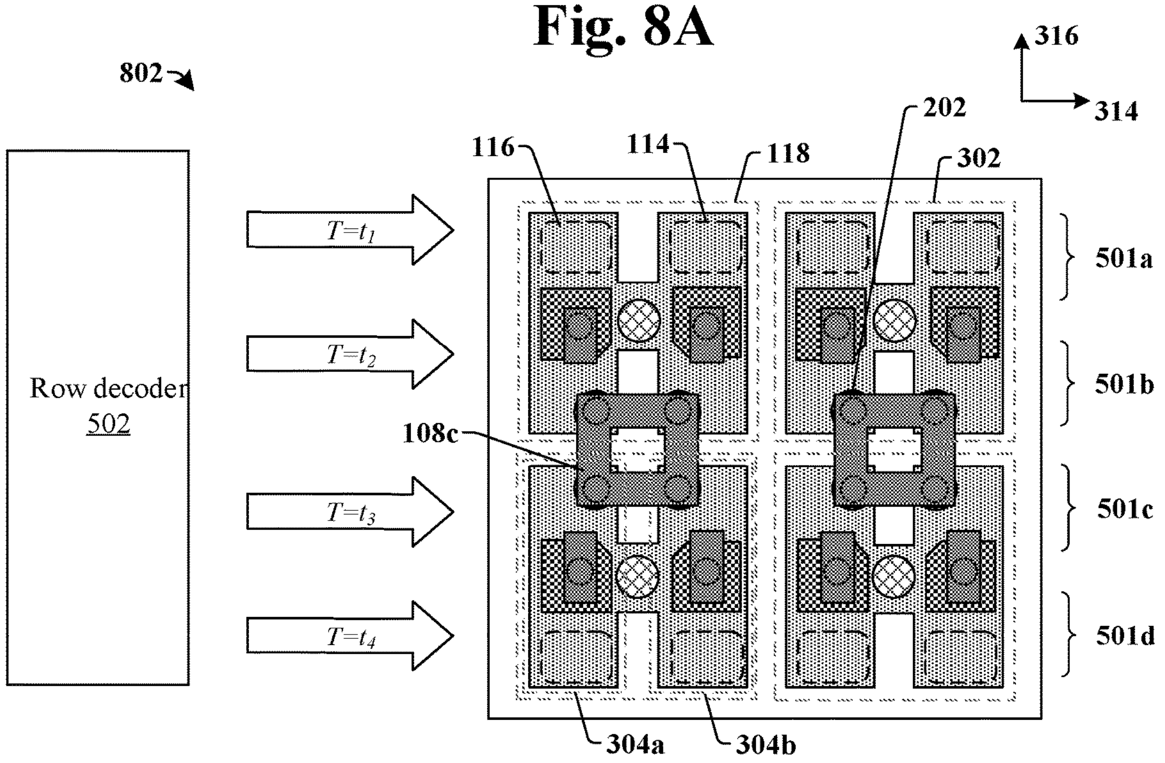

FIG. 8B illustrates a cross-sectional view 802 of some additional embodiments of a disclosed image sensor integrated chip structure comprising an array of image sensing elements disposed in a vertical dual-image sensing element configuration.

As shown in cross-sectional view 802, within respective ones of the plurality of pixel regions 118, the plurality of image sensing elements 116 are arranged next to each other along a first direction 314 (e.g., a 'horizontal' direction) that is parallel to a direction of a row that is read out prior to an adjacent row.

Figure 8C:
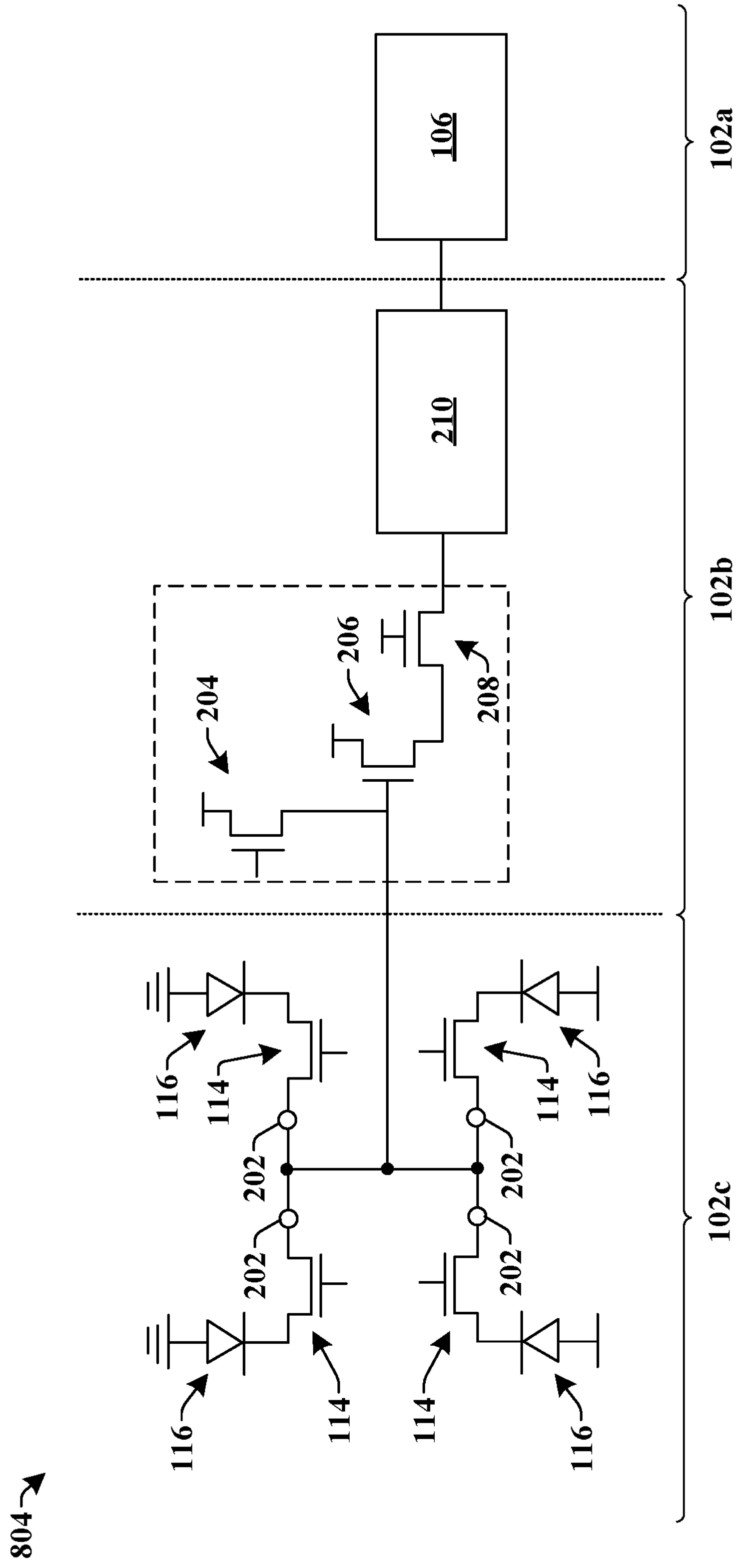

FIG. 8C illustrates a block diagram 804 of some embodiments of the image sensor integrated chip structure shown in FIG. 8A or FIG. 8B.

Figure 9:
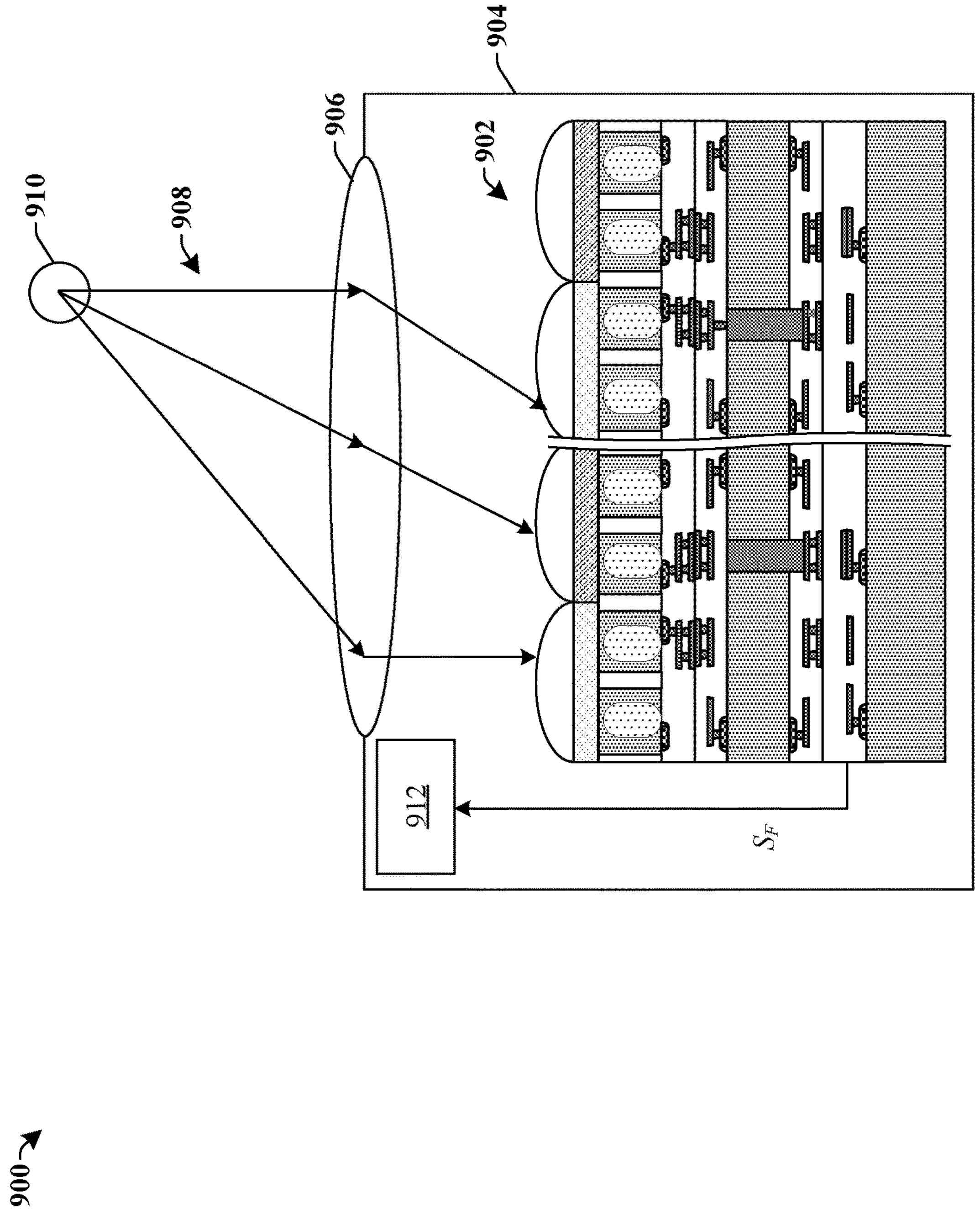
FIG. 9 illustrates some additional embodiments of a camera system comprising a disclosed image sensor integrated chip structure.

FIG. 9 illustrates some additional embodiments of a camera system 900 comprising a disclosed image sensor integrated chip structure.

The camera system 900 comprises an image sensor integrated chip structure 902 disposed within a camera housing 904. The image sensor integrated chip structure 902 comprises a multi-dimensional integrated chip structure (e.g., as shown in FIGS. 1-8B). The multi-dimensional integrated chip structure comprises a substrate having a plurality of transfer gates and a plurality of image sensing elements arranged in pixel regions comprising two or more pixels, and a substrate having a plurality of pixel support transistors. The plurality of pixel support transistors are electrically coupled to the plurality of image sensing elements by way of an interconnect structure.

A module lens 906 is arranged along a top of the camera housing 904. The module lens 906 is configured to receive incident radiation 908 (e.g., visible light, infrared-radiation, near infrared-radiation (NIR), or the like) from an object 910 and to focus the incident radiation 908 onto the image sensor integrated chip structure 902.

In some embodiments, a focal element 912 may be disposed within the camera housing 904. The focal element 912 may be configured to adjust a focus of the module lens 906 based upon a signal $S_F$ received from the image sensor integrated chip structure 902. In some embodiments, the focal element 912 may comprise an actuator configured to change a position of the module lens 906 and/or a position of the image sensor integrated chip structure 902 in response to the signal $S_F$ received from the image sensor integrated chip structure 902.

It will be appreciated that the integration of the disclosed image sensor integrated chip structure within a camera system 900 is not intended to be limiting, but rather that the disclosed image sensor integrated chip structure may be implemented in a wide range of different devices and/or applications. For example, in various embodiments, the disclosed image sensor integrated chip structure may be integrated within smartphone applications, automotive applications, NIR applications, applications with global shutter schemes, and/or the like.

FIGS. 10-32 illustrate cross-sectional views 1000-3200 corresponding to some embodiments of a method of forming an integrated chip structure comprising separate integrated chip tiers including image sensing elements and pixel support devices. Although FIGS. 10-32 are described in relation to a method, it will be appreciated that the structures disclosed in the method are not limited to the method, but instead may stand alone as structures independent of the method.

Figure 10:
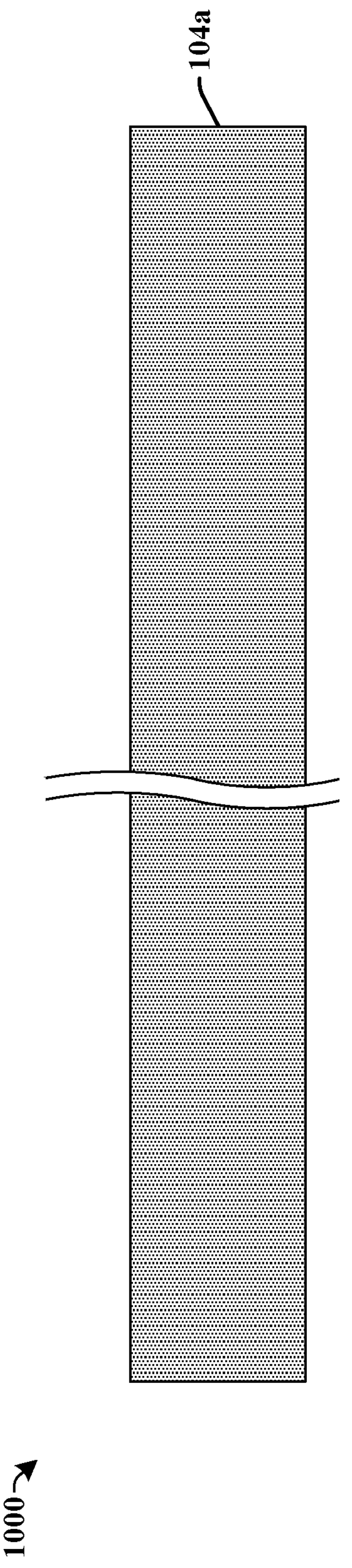
FIGS. 10-32 illustrate some embodiments of a method of forming an integrated chip structure comprising separate integrated chip tiers including image sensing elements and pixel support devices.

As shown in cross-sectional view 1000 of FIG. 10, a first substrate 104*a* is provided. In various embodiments, the first substrate 104*a* may be any type of semiconductor body (e.g., silicon, SiGe, etc.), such as a semiconductor wafer and/or one or more die on a wafer, as well as any other type of semiconductor and/or epitaxial layers, associated therewith.

Figure 11:
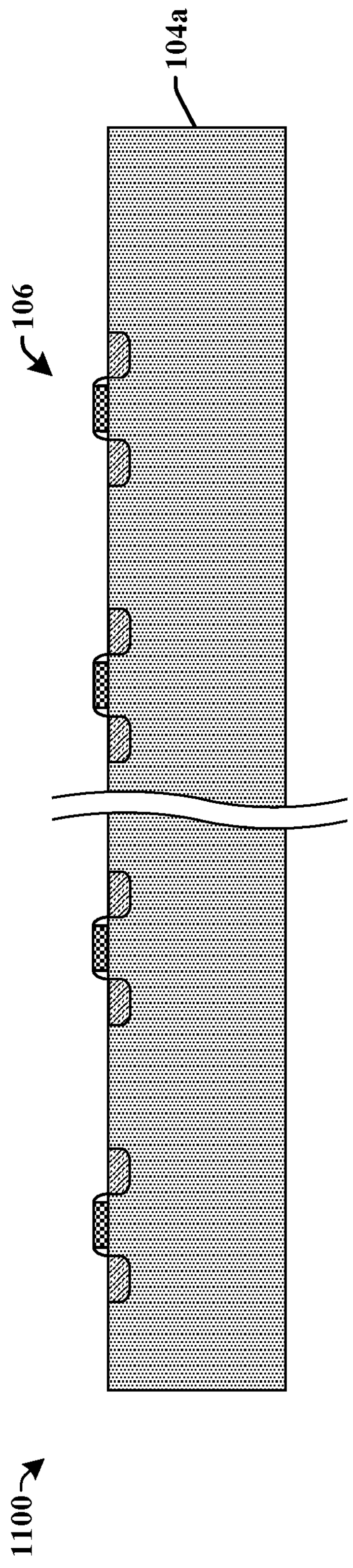

As shown in cross-sectional view 1100 of FIG. 11, a plurality of logic devices 106 are formed on and/or within the first substrate 104*a*. In some embodiments, the plurality of logic devices 106 may comprise a transistor formed by depositing a gate dielectric film and a gate electrode film over the first substrate 104*a*. The gate dielectric film and the gate electrode film are subsequently patterned to form a gate dielectric and a gate electrode. The first substrate 104*a* may be subsequently implanted to form source/drain regions within the first substrate 104*a* and on opposing sides of the gate electrode.

As shown in cross-sectional view 1200, a first interconnect structure 108*a* is formed onto a first side (e.g., a front-side) of the first substrate 104*a*. The first interconnect structure 108*a* comprises a first plurality of interconnects 110*a* formed within a first ILD structure 109*a* comprising one or more ILD layers. In some embodiments, the first interconnect structure 108*a* may be formed using a damascene process (e.g., a single damascene process and/or a dual damascene process). For example, the damascene process is performed by forming an ILD layer over the first side of the first substrate 104*a*, etching the ILD layer to form a via hole and/or a trench, and filling the via hole and/or trench with a conductive material, and performing a planarization process (e.g., a chemical mechanical planarization process) to remove excess of the conductive material from over the ILD layer. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the conductive material may comprise tungsten, copper, aluminum, aluminum copper, or the like.

Figure 13:
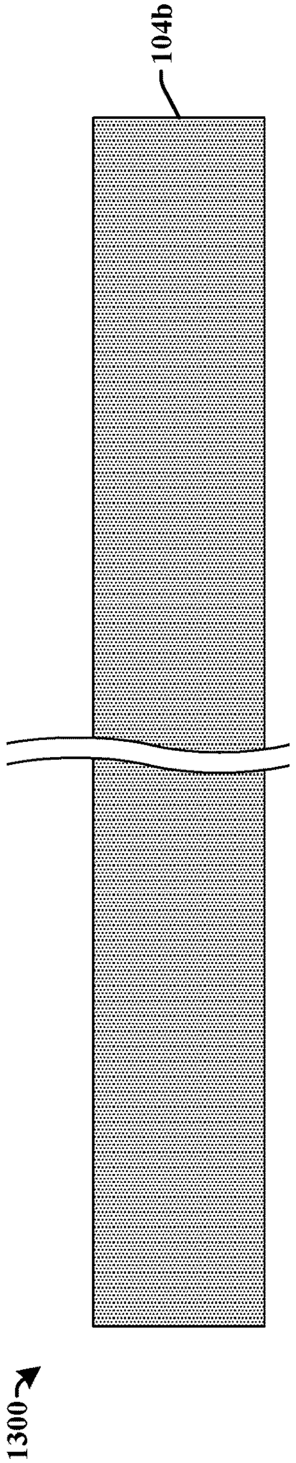

As shown in cross-sectional view 1300 of FIG. 13, a second substrate 104*b* is provided. In various embodiments, the second substrate 104*b* may be any type of semiconductor body (e.g., silicon, SiGe, etc.), such as a semiconductor wafer and/or one or more die on a wafer, as well as any other type of semiconductor and/or epitaxial layers, associated therewith.

Figure 14:
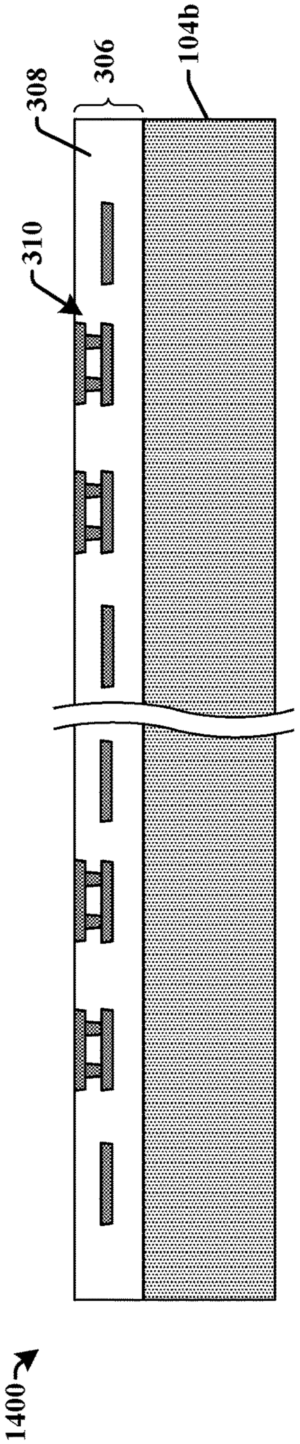

As shown in cross-sectional view 1400 of FIG. 14, an additional interconnect structure 306 is formed onto a second side (e.g., a back-side) of the second substrate 104*b*. The additional interconnect structure 306 comprises a plurality of additional interconnects 310 formed within an additional ILD structure 308. In some embodiments, the additional interconnect structure 306 may be formed using a damascene process (e.g., a single damascene process and/or a dual damascene process).

Figure 15:
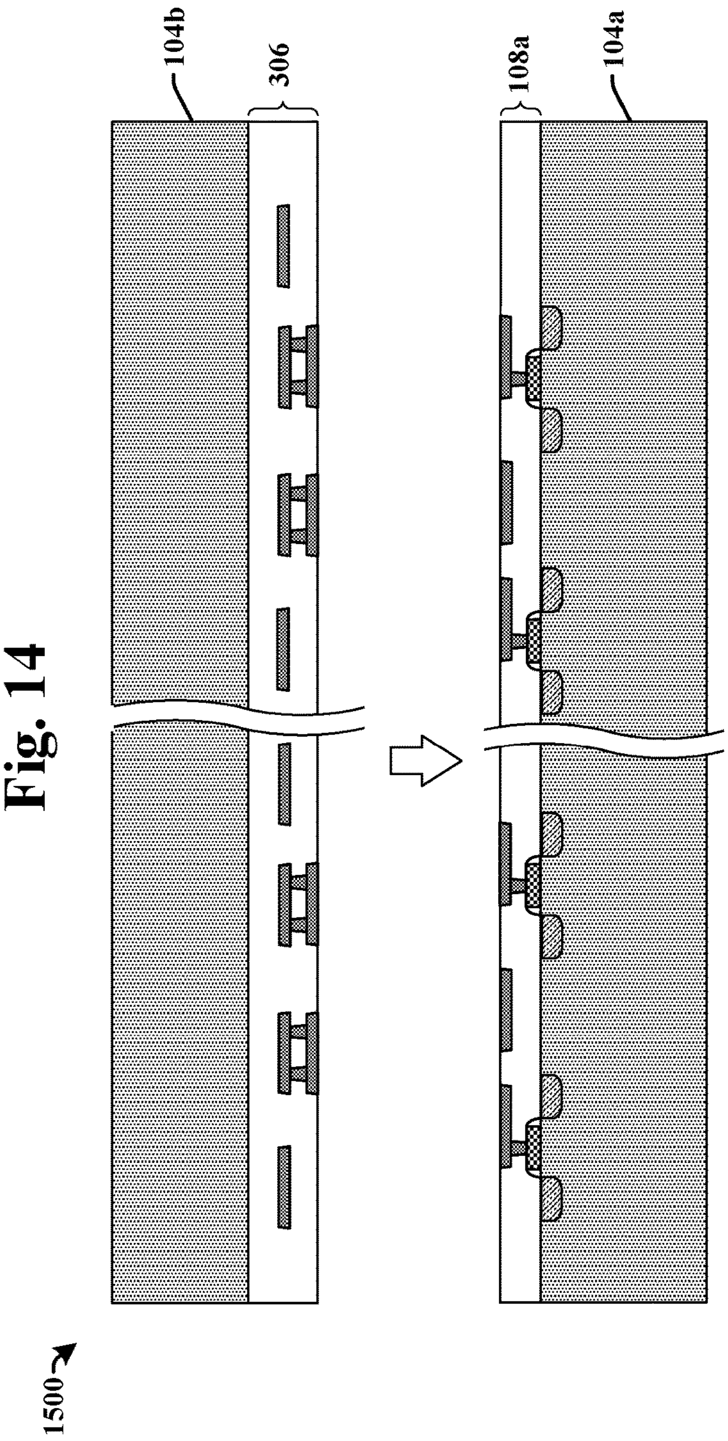

As shown in cross-sectional view 1500 of FIG. 15, the second substrate 104*b* is bonded to the first substrate 104*a*. In some embodiments, the second substrate 104*b* may be bonded to the first substrate 104*a* so that the first interconnect structure 108*a* and the additional interconnect structure 306 are between the first substrate 104*a* and the second substrate 104*b*. In various embodiments, the second substrate 104*b* may be bonded to the first substrate 104*a* by way of a bonding process that forms a bonding interface comprising a dielectric interface and a metal interface.

Figure 16:
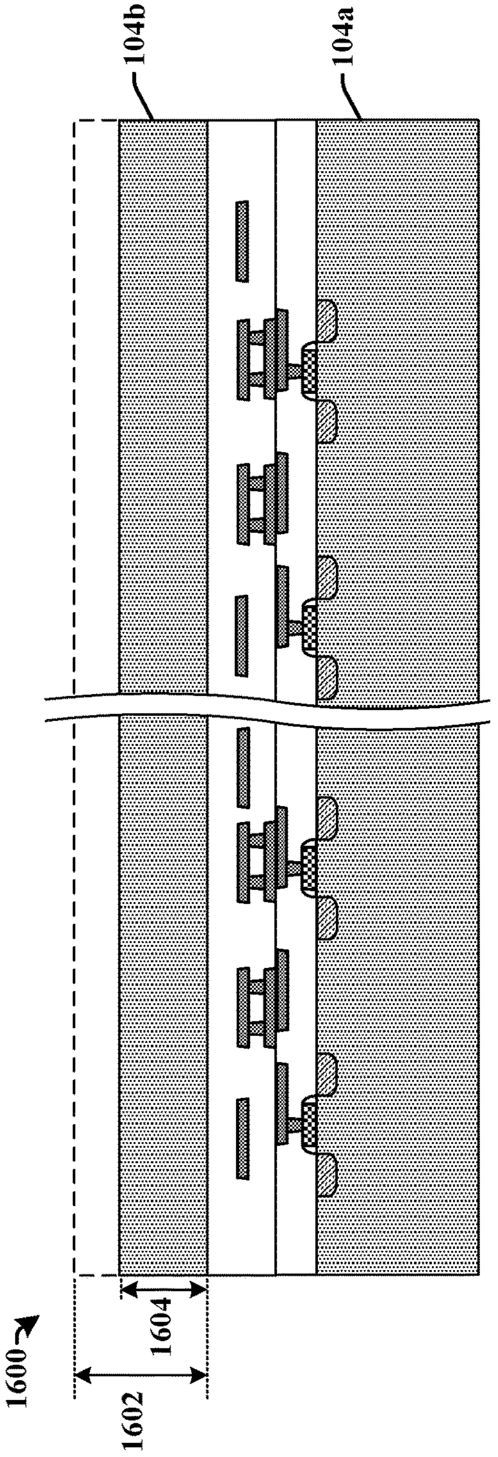

As shown in cross-sectional view 1600 of FIG. 16, a thickness of the second substrate 104*b* is reduced. In some embodiments, the thickness of the second substrate 104*b* may be reduced by performing a first grinding process on the second substrate 104*b* to reduce the thickness of the second substrate 104*b* from a first thickness 1602 to a second thickness 1604 that is less than the first thickness 1602. In some embodiments, the first thickness 1602 may be in a first range of between approximately 595 μm and approximately 950 μm, between approximately 700 μm and 800 μm, or other suitable values. In some embodiments, the second thickness 1604 may be in a second range of between approximately 50 μm and approximately 250 μm, between approximately 100 μm and approximately 200 μm, or other suitable values.

Figure 17:
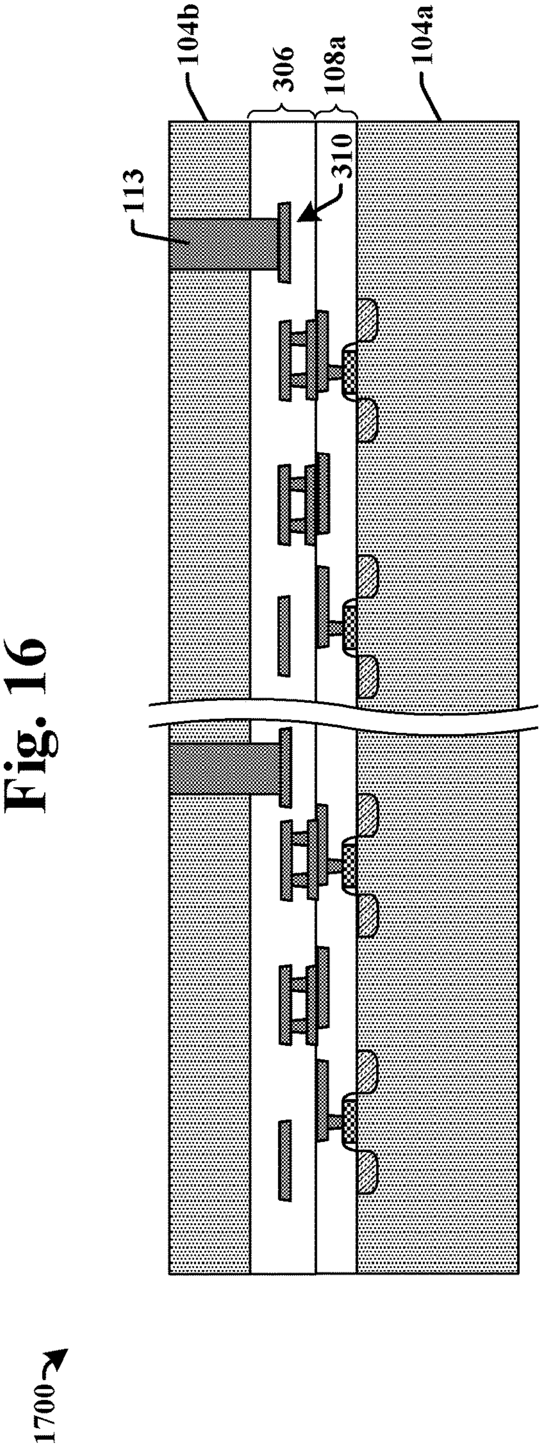

As shown in cross-sectional view 1700 of FIG. 17, a plurality of through-substrate-vias (TSVs) 113 are formed to extend through the second substrate 104*b*. The plurality of TSVs 113 are formed by performing a first etching process to selectively etch through the second substrate 104*b* and/or the additional interconnect structure 306 to form one or more TSV openings. A dielectric is formed onto sidewalls of the second substrate 104*b* and within the one or more TSV openings. A second etching process may be performed to expose one or more of the additional interconnects 310. A conductive material is subsequently formed within the TSV openings followed by a planarization process (e.g., a CMP process).

Figure 18:
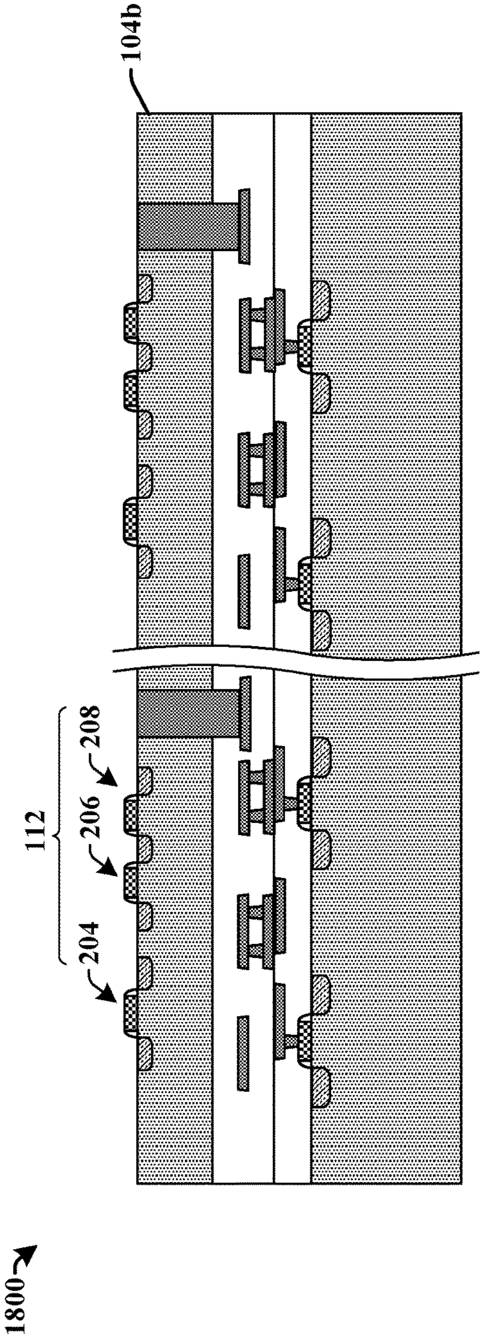

As shown in cross-sectional view 1800 of FIG. 18, a plurality of pixel support devices 112 are formed on and/or within the second substrate 104*b*. In some embodiments, the plurality of pixel support devices 112 may comprise a reset transistor 204, a source-follower transistor 206, and/or a row-select transistor 208. In some embodiments, the plurality of pixel support devices 112 may be formed by depositing a gate dielectric film and a gate electrode film over the second substrate 104*b*. The gate dielectric film and the gate electrode film are subsequently patterned to form a gate dielectric and a gate electrode. The second substrate 104*b* may be subsequently implanted to form source/drain regions within the second substrate 104*b* and on opposing sides of the gate electrode.

Figure 19:
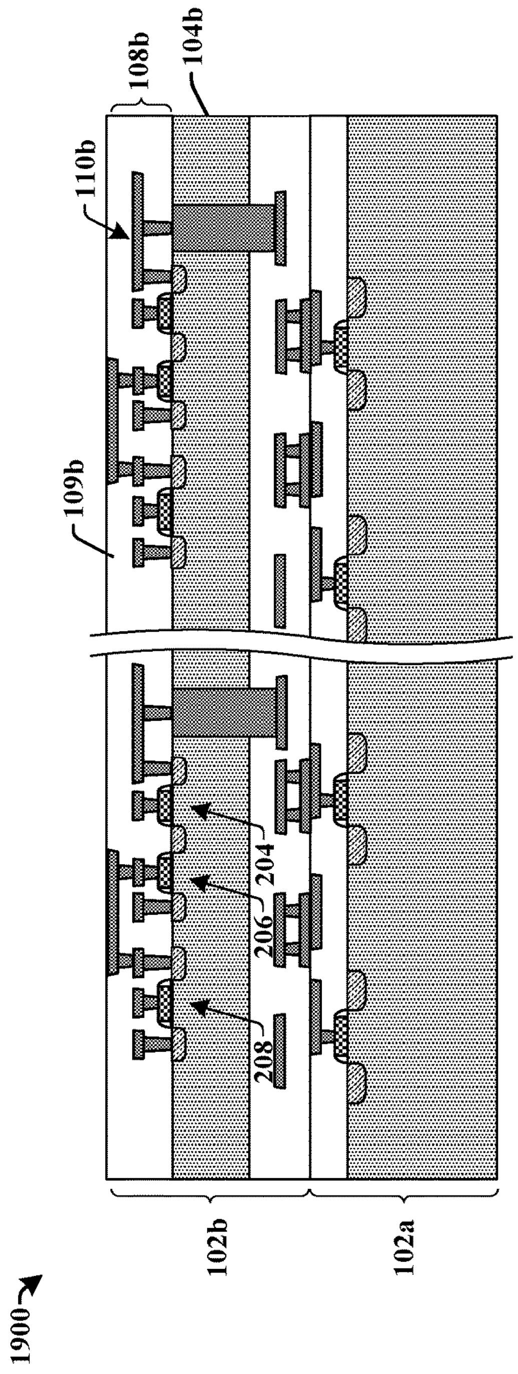

As shown in cross-sectional view 1900 of FIG. 19, a second interconnect structure 108*b* is formed onto a first side (e.g., a front-side) of the second substrate 104*b*. The second interconnect structure 108*b* comprises a second plurality of interconnects 110*b* formed within a second ILD structure 109*b* comprising one or more ILD layers. In some embodiments, the second interconnect structure 108*b* may be formed using a damascene process (e.g., a single damascene process and/or a dual damascene process).

Figure 20:
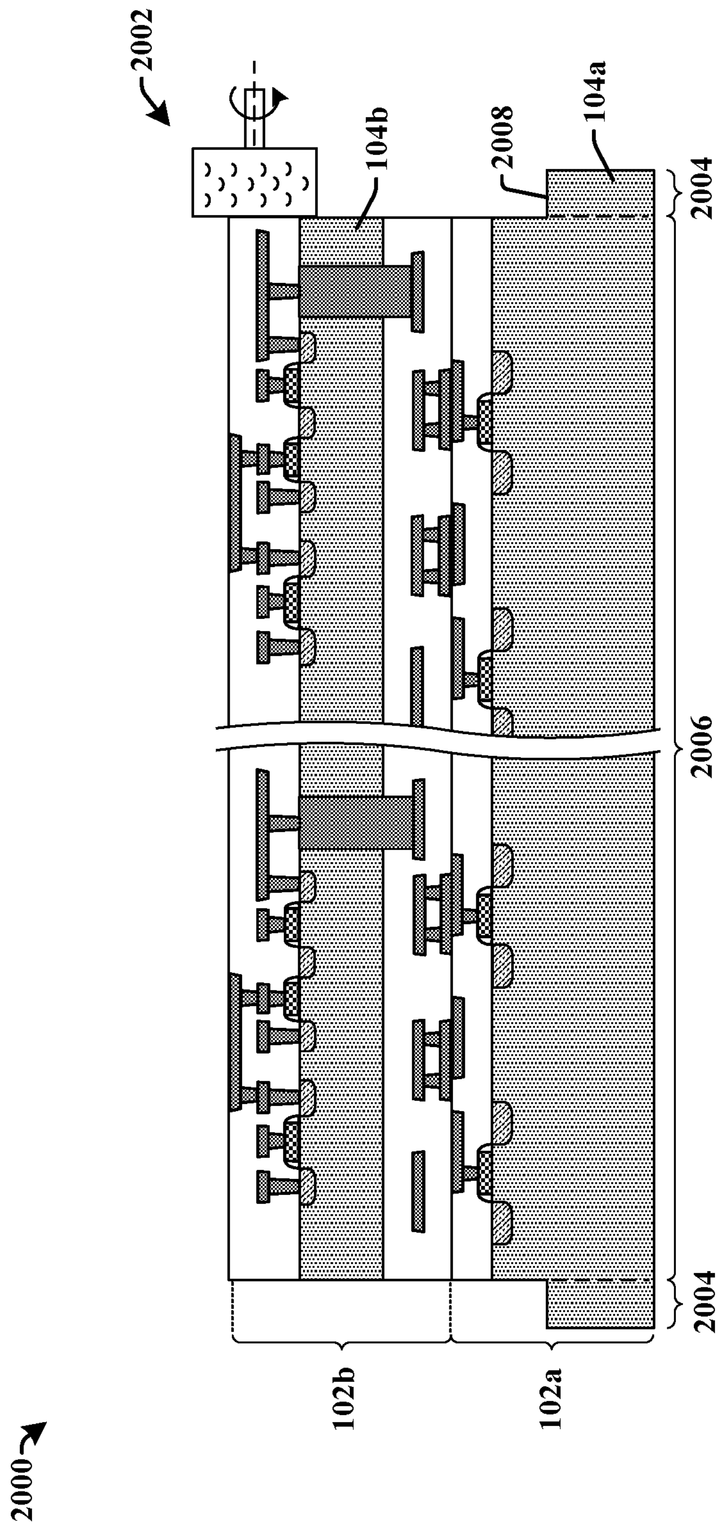

As shown in cross-sectional view 2000 of FIG. 20, a first edge trimming cut is performed on the first substrate 104*a* and the second substrate 104*b*. The first edge trimming cut removes peripheral portions 2004 of the first substrate 104*a* and the second substrate 104*b* that surround a central portion 2006 of the first substrate 104*a* and the second substrate 104*b*. In some embodiments, the first edge trimming cut forms a recessed upper surface 2008 within the first substrate 104*a*. In some embodiments, the first edge trimming cut may be performed by bringing a first blade 2002 into contact with the second substrate 104*b* along a closed loop. The first blade 2002 has abrasive elements (e.g., diamond particles) bonded to a core having a circular cross-section. The core is configured to rotate around a first axis, as the abrasive elements are brought into contact with the second substrate 104*b*.

Figure 21:
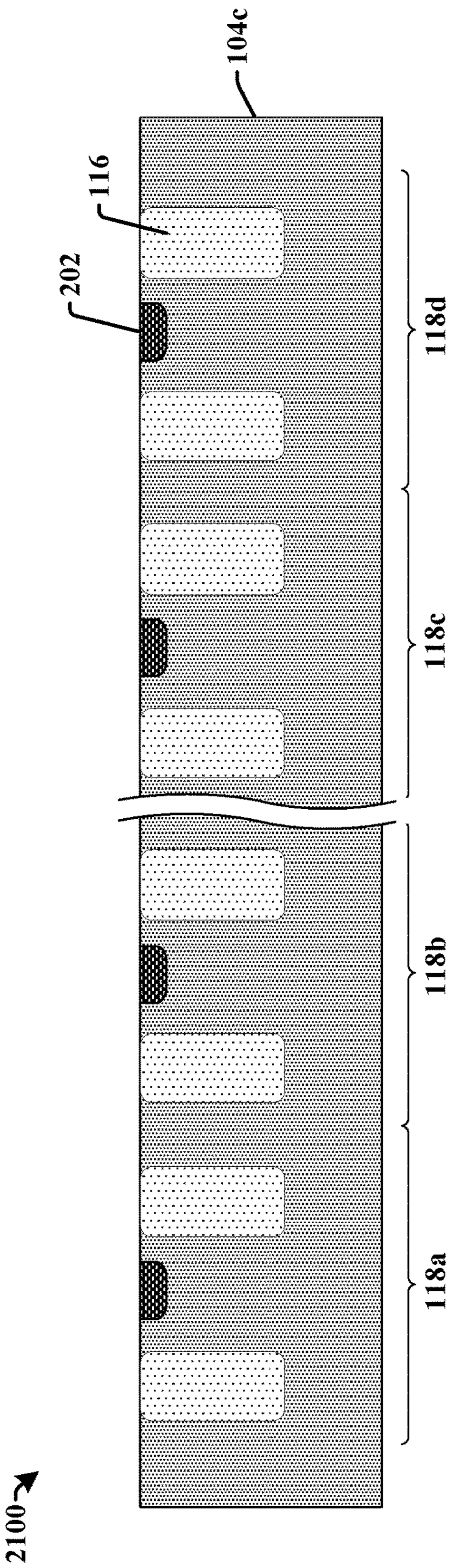

As shown in cross-sectional view 2100 of FIG. 21, a plurality of image sensing elements 116 are formed within a plurality of pixel regions 118*a*-118*d* within a third substrate 104*c*. In some embodiments, the plurality of image sensing elements 116 may comprise a photodiode formed by implanting one or more dopant species into a first side (e.g., a front-side) of the third substrate 104*c*. For example, the plurality of image sensing elements 116 may be formed by selectively performing a first implantation process (e.g., according to a first masking layer) to form a first region having a first doping type (e.g., n-type), and subsequently performing a second implantation process to form a second region abutting the first region and having a second doping type (e.g., p-type) different than the first doping type.

In some embodiments a floating diffusion region 202 may also be formed within the third substrate 104*c*. The floating diffusion region 202 may be formed by selectively implanting one or more dopants into the third substrate 104*c* according to a second masking layer. In some embodiments, the floating diffusion region 202 may be formed using one of the first or second implantation processes.

Figure 22:
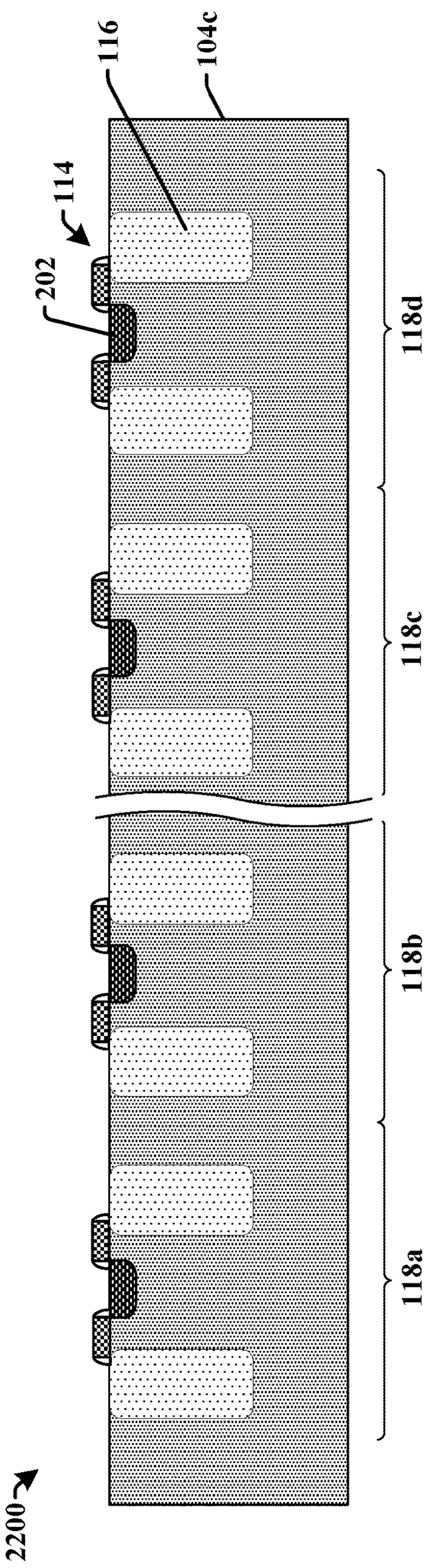

As shown in cross-sectional view 2200 of FIG. 22, a plurality of transfer gates 114 are formed along the first side of the third substrate 104*c* and within the plurality of pixel regions 118*a*-118*d*. In some embodiments, the plurality of transfer gates 114 may be formed by depositing a gate dielectric film and a gate electrode film on the first side of the third substrate 104*c*. The gate dielectric film and the gate electrode film are subsequently patterned to form a gate dielectric layer and a gate electrode. Sidewall spacers may be formed on the outer sidewalls of the gate electrode. In some embodiments, the sidewall spacers may be formed by depositing a spacer layer (e.g., a nitride, an oxide, etc.) onto the first side of the third substrate 104*c* and selectively etching the spacer layer to form the sidewall spacers.

Figure 23:
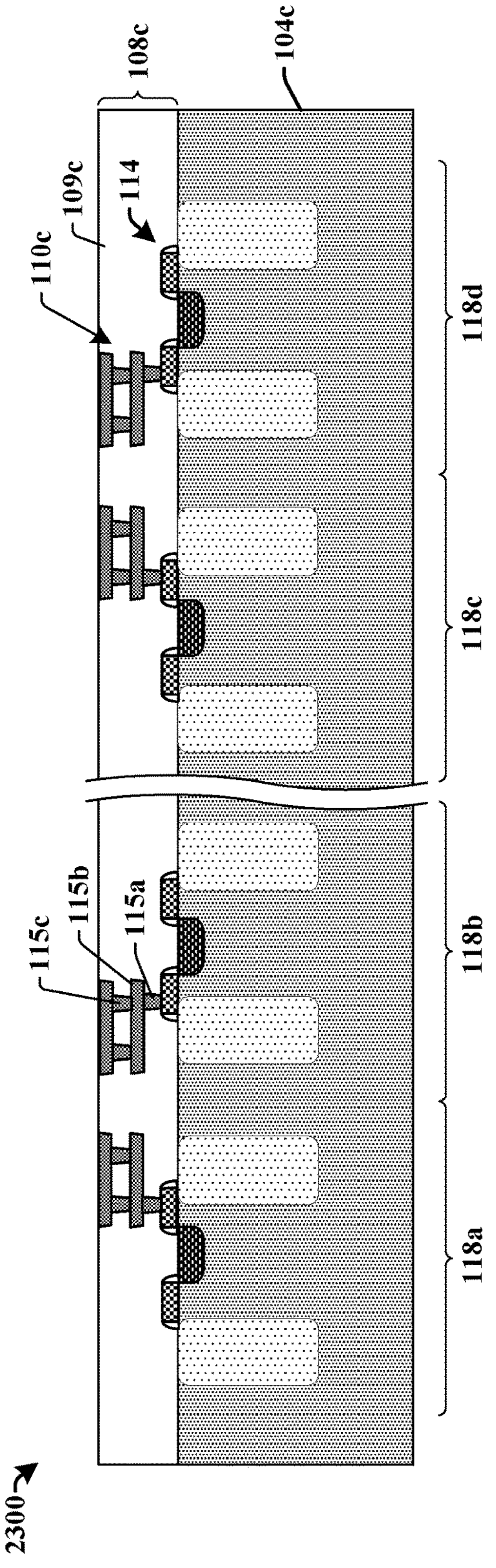

As shown in cross-sectional view 2300 of FIG. 23, a third interconnect structure 108*c* is formed onto a first side of the third substrate 104*c*. The third interconnect structure 108*c* comprises a third plurality of interconnects 110*c* formed within a third ILD structure 109*c* comprising one or more ILD layers. The third plurality of interconnects 110*c* include conductive contacts 115*a*, interconnects wires 115*b*, and/or interconnect vias 115*c*. In some embodiments, the third interconnect structure 108*c* may be formed using a damascene process (e.g., a single damascene process and/or a dual damascene process).

Figure 24:
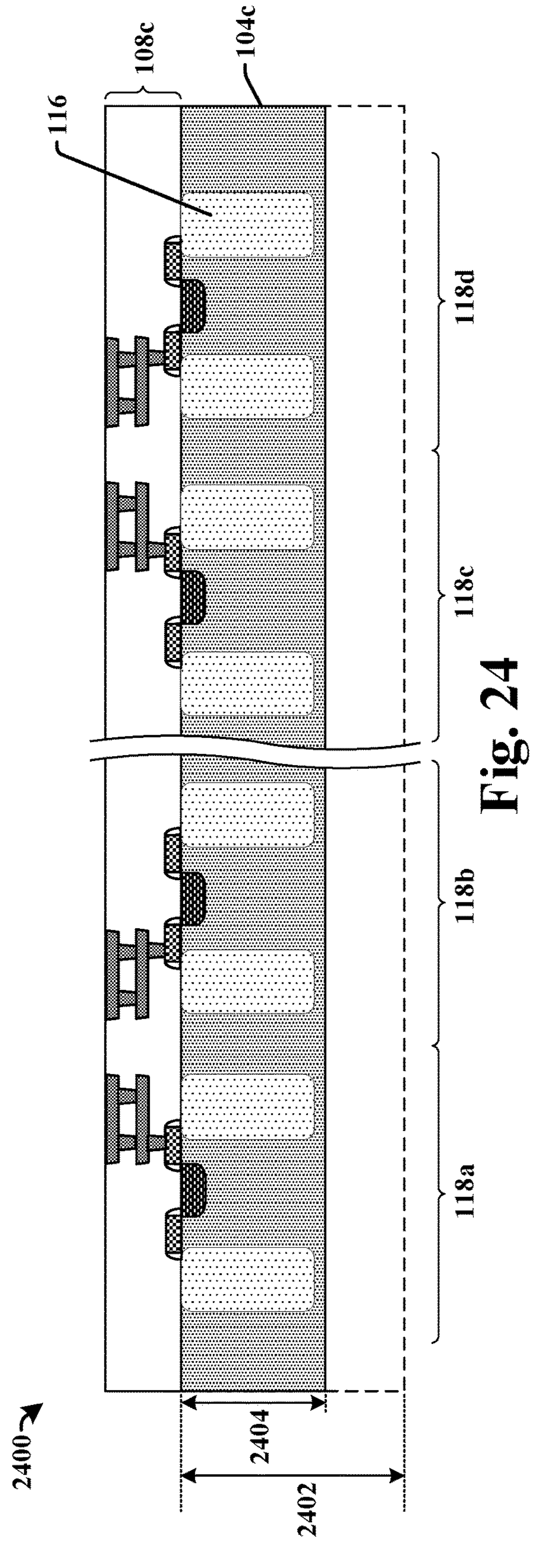

As shown in cross-sectional view 2400 of FIG. 24, a thickness of the third substrate 104*c* is reduced. In some embodiments, the thickness of the third substrate 104*c* may be reduced by performing a second grinding process on the third substrate 104*c* to reduce the thickness of the third substrate 104*c* from a first thickness 2402 to a second thickness 2404 that is less than the first thickness 2402. Thinning the third substrate 104*c* allows for radiation to pass more easily to the plurality of image sensing elements 116. In various embodiments, the third substrate 104*c* may be thinned by etching and/or mechanical grinding a second side of the third substrate 104*c*.

Figure 25:
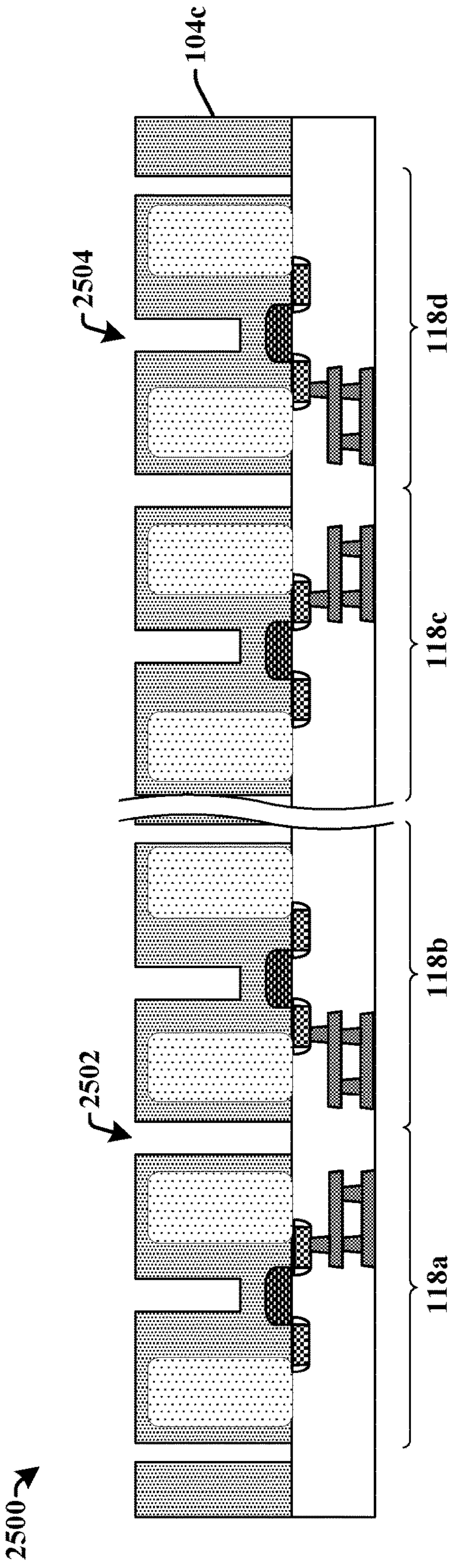

As shown in cross-sectional view 2500 of FIG. 25, one or more trenches 2502 are formed within a second side (e.g., a back-side) of the third substrate 104*c*. The one or more trenches 2502 vertically extend from the second side of the third substrate 104*c* to within the third substrate 104*c* along opposing sides of the plurality of pixel regions 118*a*-118*d*. In some embodiments, the one or more trenches 2502 may be formed by selectively etching the second side of the third substrate 104*c* with a first etching process. In some embodiments, the second side of the third substrate 104*c* may be selectively etched by exposing the second side of the third substrate 104*c* to one or more third etchants according to a third masking layer. In some embodiments, the third masking layer may comprise a photoresist, a hard mask, or the like. In some embodiments, the one or more third etchants may comprise a dry etchant. In some embodiments, the dry etchant may have an etching chemistry comprising one or more of oxygen ($O_2$), nitrogen ($N_2$), hydrogen ($H_2$), argon (Ar), and/or a fluorine species (e.g., $CF_4$, $CHF_3$, $C_4F_8$, etc.).

In some additional embodiments, the one or more additional trenches 2504 may be formed by selectively etching the second side of the third substrate 104*c* with a second etching process. In some embodiments, the second side of the third substrate 104*c* may be selectively etched by exposing the second side of the third substrate 104*c* to one or more fourth etchants according to a fourth masking layer. The one or more additional trenches 2504 may extend into the third substrate 104*c* to a lesser depth than the one or more trenches 2502. In other additional embodiments (not shown), an isolation implantation process may be performed to form an isolation implantation region within the third substrate 104*c*.

Figure 26:
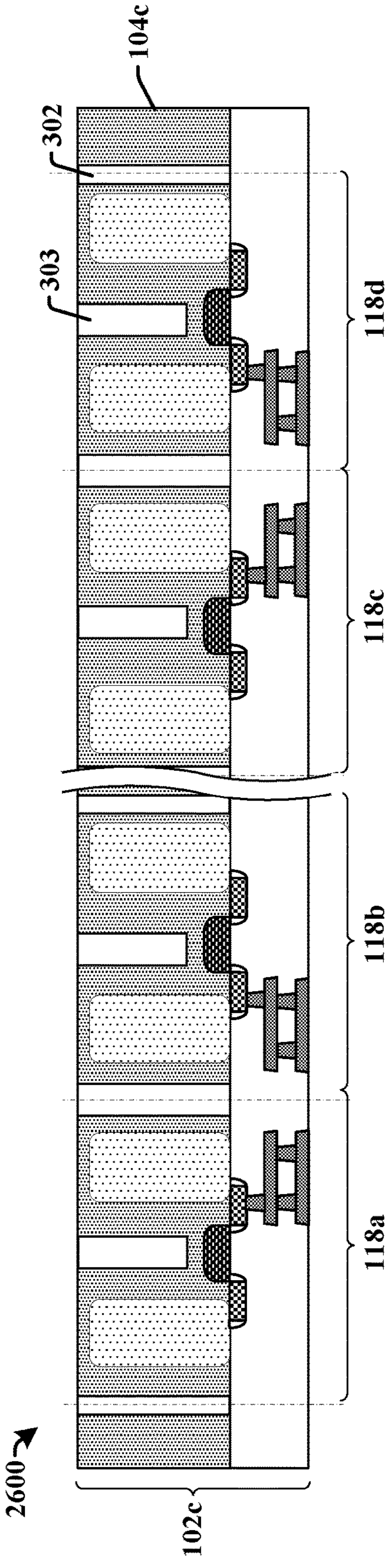

As shown in cross-sectional view 2600 of FIG. 26, one or more dielectric materials are formed within the trenches 2502 to form an isolation structure 302 on opposing sides of the plurality of pixel regions 118*a*-118*d*. In some embodiments, the one or more dielectric materials may be formed to line interior surface of the third substrate 104*c* defining the one or more trenches 2502 and to further cover the second side of the third substrate 104*c*. In some such embodiments, after forming the one or more dielectric materials, a planarization process (e.g., a chemical mechanical planarization (CMP) process) may be performed to remove the one or more dielectric materials from the second side of the third substrate 104*c*. In some embodiments, the one or more dielectric materials may be formed by way of a vapor deposition process (e.g., a chemical vapor deposition (CVD) process, a plasma enhanced CVD process, or the like). In other embodiments, the one or more dielectric materials may be formed by way of an atomic layer deposition (ALD) process. The one or more dielectric materials may also be formed within the one or more additional trenches 2504 to form one or more additional isolation regions 303.

Figure 27:
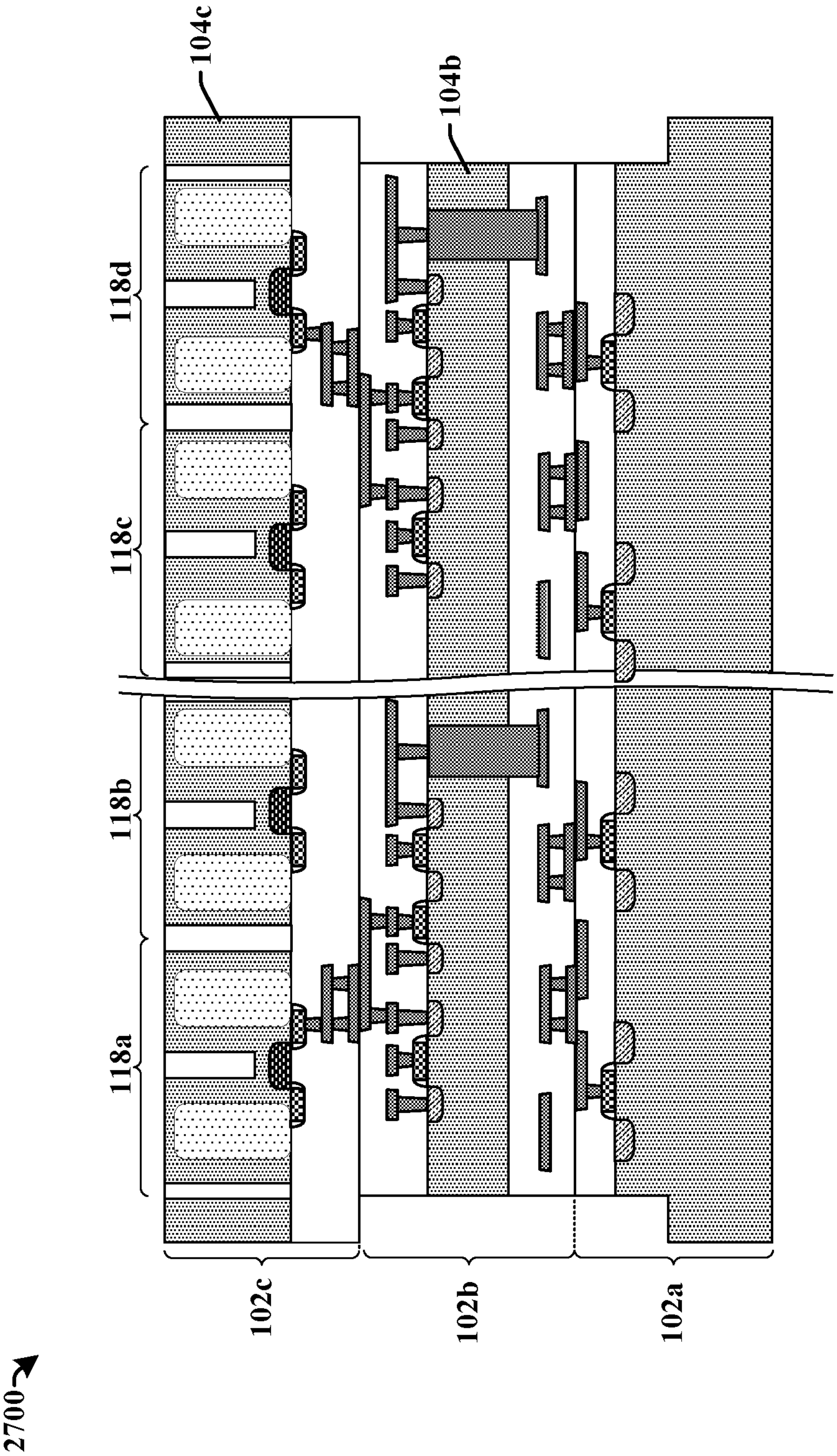

As shown in cross-sectional view 2700 of FIG. 27, the second substrate 104*b* is bonded to the third substrate 104*c*. In various embodiments, the second substrate 104*b* may be bonded to the third substrate 104*c* by way of a bonding process that forms a bonding interface comprising a dielectric interface and a metal interface.

Figure 28:
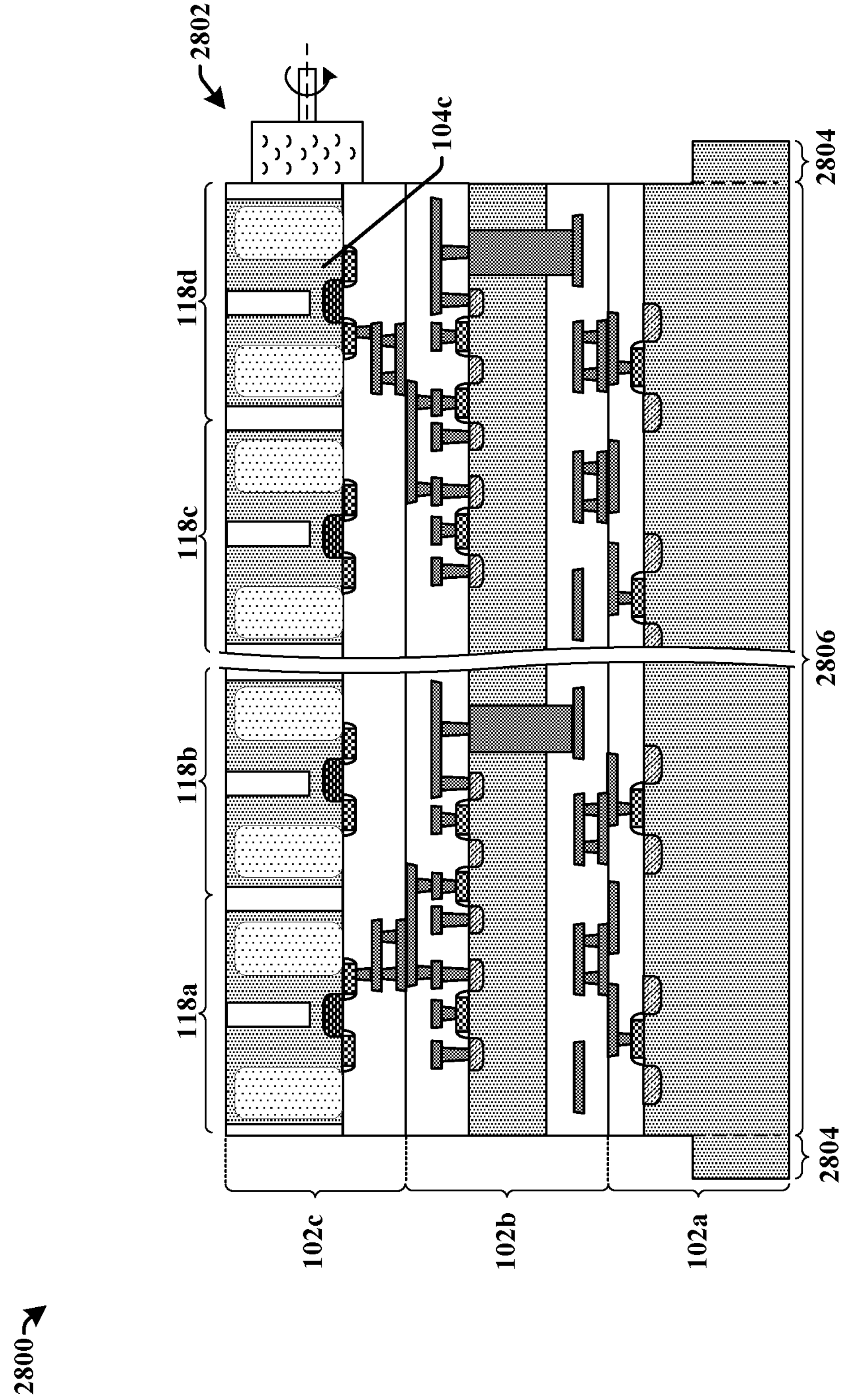

As shown in cross-sectional view 2800 of FIG. 28, a second edge trimming cut is performed into a peripheral portion 2804 of the third substrate 104*c* surrounding a central portion 2806 of the third substrate 104*c*. The second edge trimming cut removes the peripheral portion 2804 of the third substrate 104*c*. In some embodiments, the second edge trimming cut may be performed by bringing a second blade 2802 into contact with the third substrate 104*c* along a closed loop.

Figure 29:
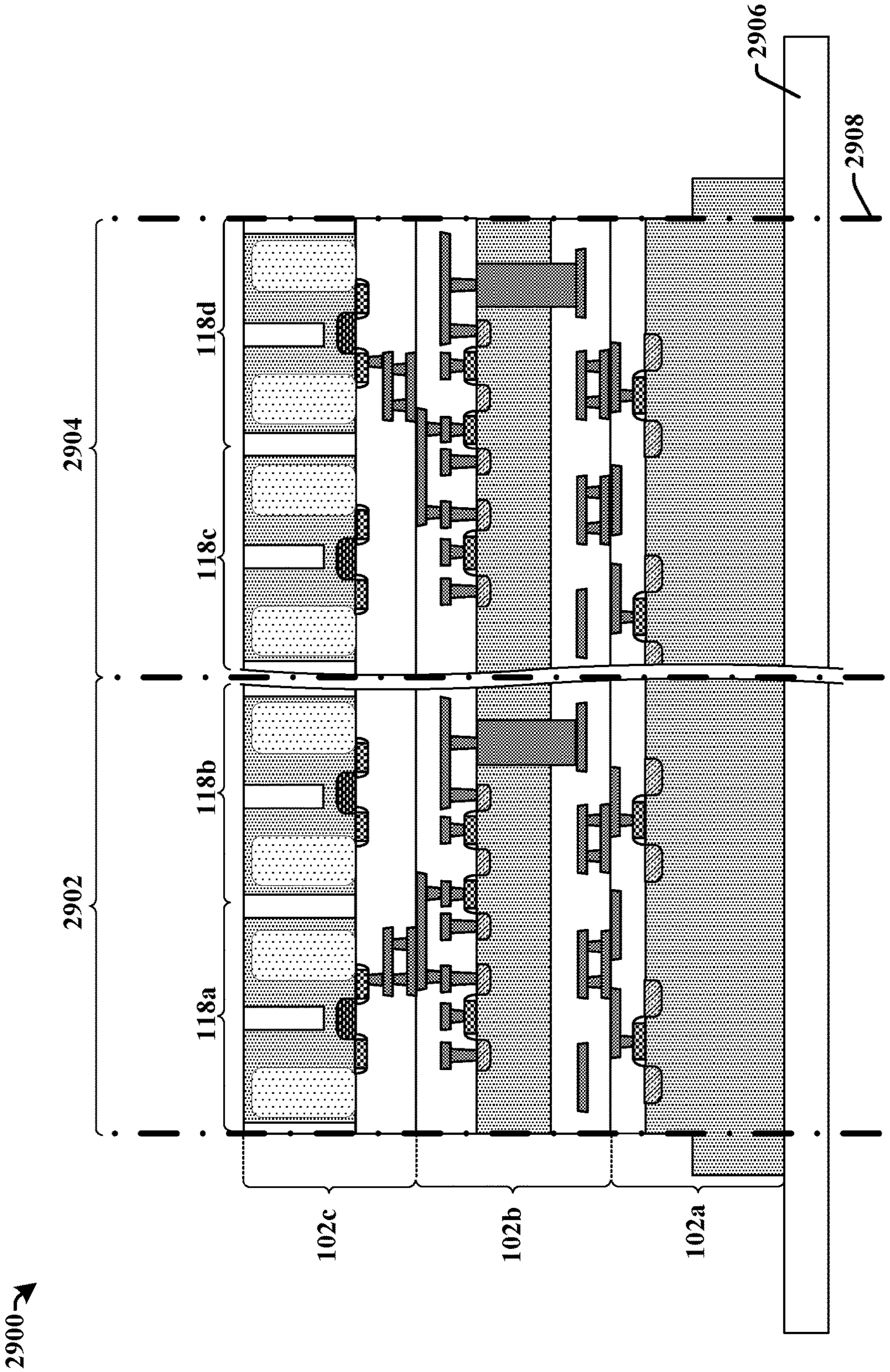

As shown in cross-sectional view 2900 of FIG. 29, the semiconductor structure is singulated to form a plurality of integrated chip die 2902-2904. In some embodiments, the semiconductor structure may be singulated by a dicing process that mounts the semiconductor structure onto a sticky surface of a piece of dicing tape 2906. A wafer saw then cuts the wafer along scribe lines 2908 to separate the wafer into the plurality of integrated chip die 2902-2904.

Figure 30:
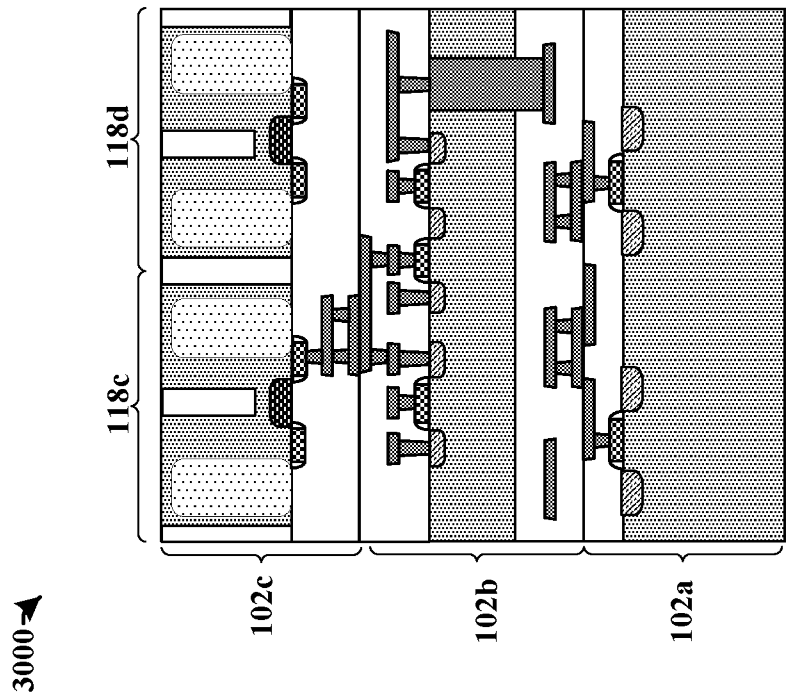

As shown in cross-sectional view 3000 of FIG. 30, an integrated chip die of the plurality of integrated chip die (2902-2904 of FIG. 29) are removed from the piece of dicing tape (2906 of FIG. 29).

Figure 31:
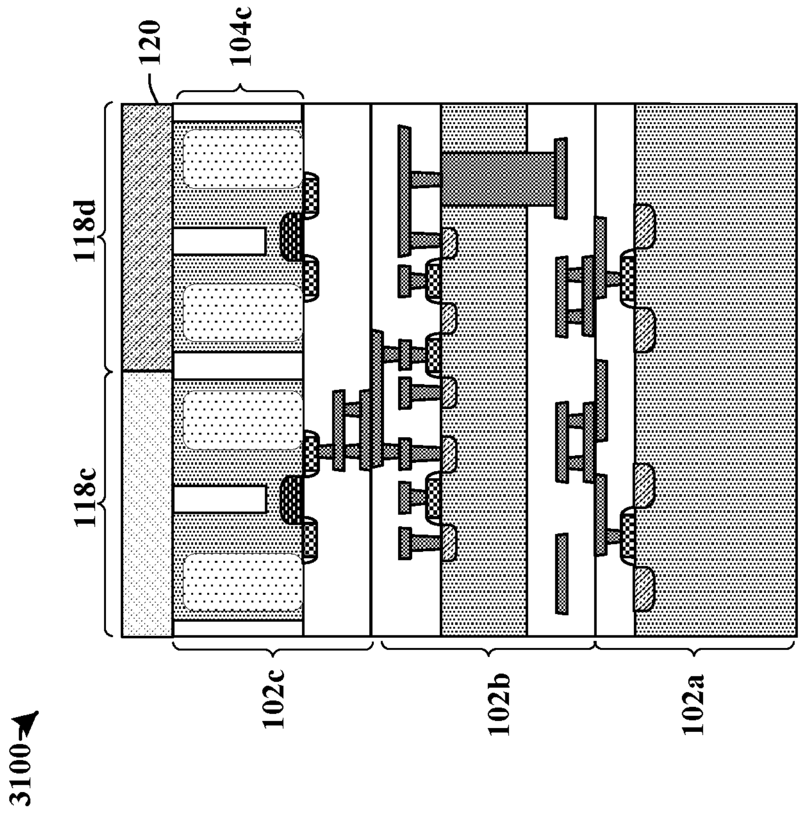

As shown in cross-sectional view 3100 of FIG. 31, a plurality of color filters 120 are formed over the third substrate 104*c*. In some embodiments, the plurality of color filters 120 are formed by depositing (e.g., via CVD, PVD, ALD, sputtering, a spin-on process, etc.) a light filtering material(s) onto the third substrate 104*c*. The light filtering material(s) is a material that allows for the transmission of radiation (e.g., light) having a specific wavelength range, while blocking light of wavelengths outside of the specified range. Subsequently, in some embodiments, a planarization process (e.g., CMP) may be performed on the plurality of color filters 120 to planarize the upper surfaces of the plurality of color filters 120.

Figure 32:
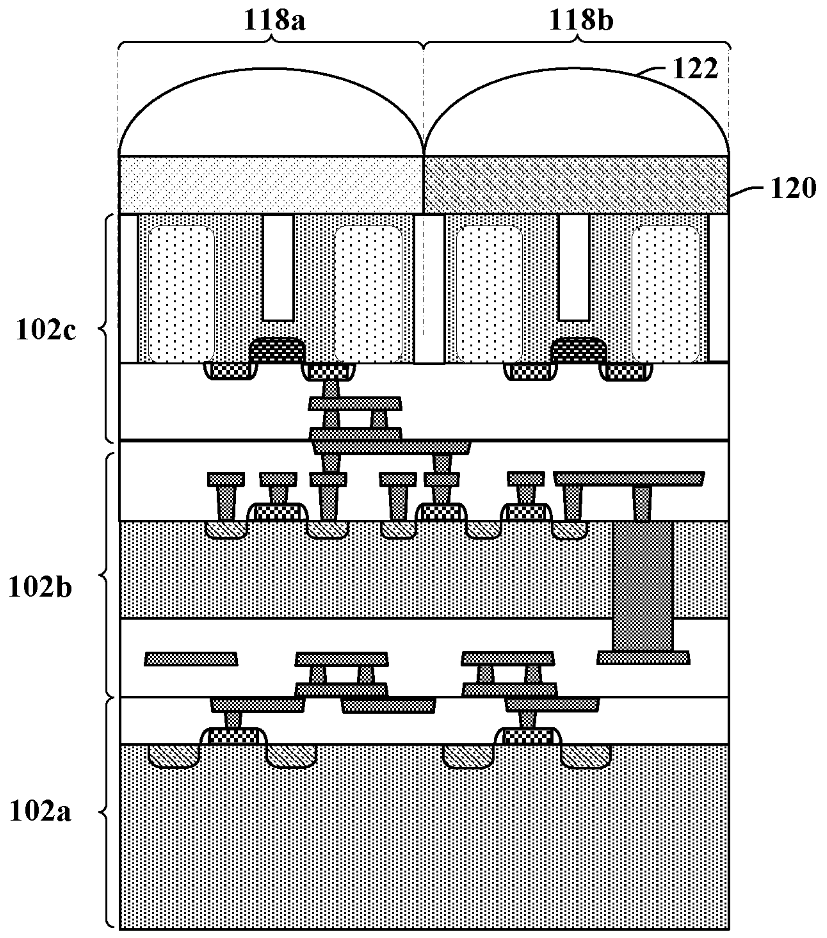

As shown in cross-sectional view 3200 of FIG. 32, a plurality of micro-lenses 122 are formed over the plurality of color filters 120. In some embodiments, the plurality of micro-lenses 122 may be formed by depositing a micro-lens material on the plurality of color filters 120 (e.g., via CVD, PVD, ALD, sputtering, a spin-on process, etc.). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed, and baked to form a rounding shape. The plurality of micro-lenses 122 are then formed by selectively etching the micro-lens material according to the micro-lens template.

Figure 33:
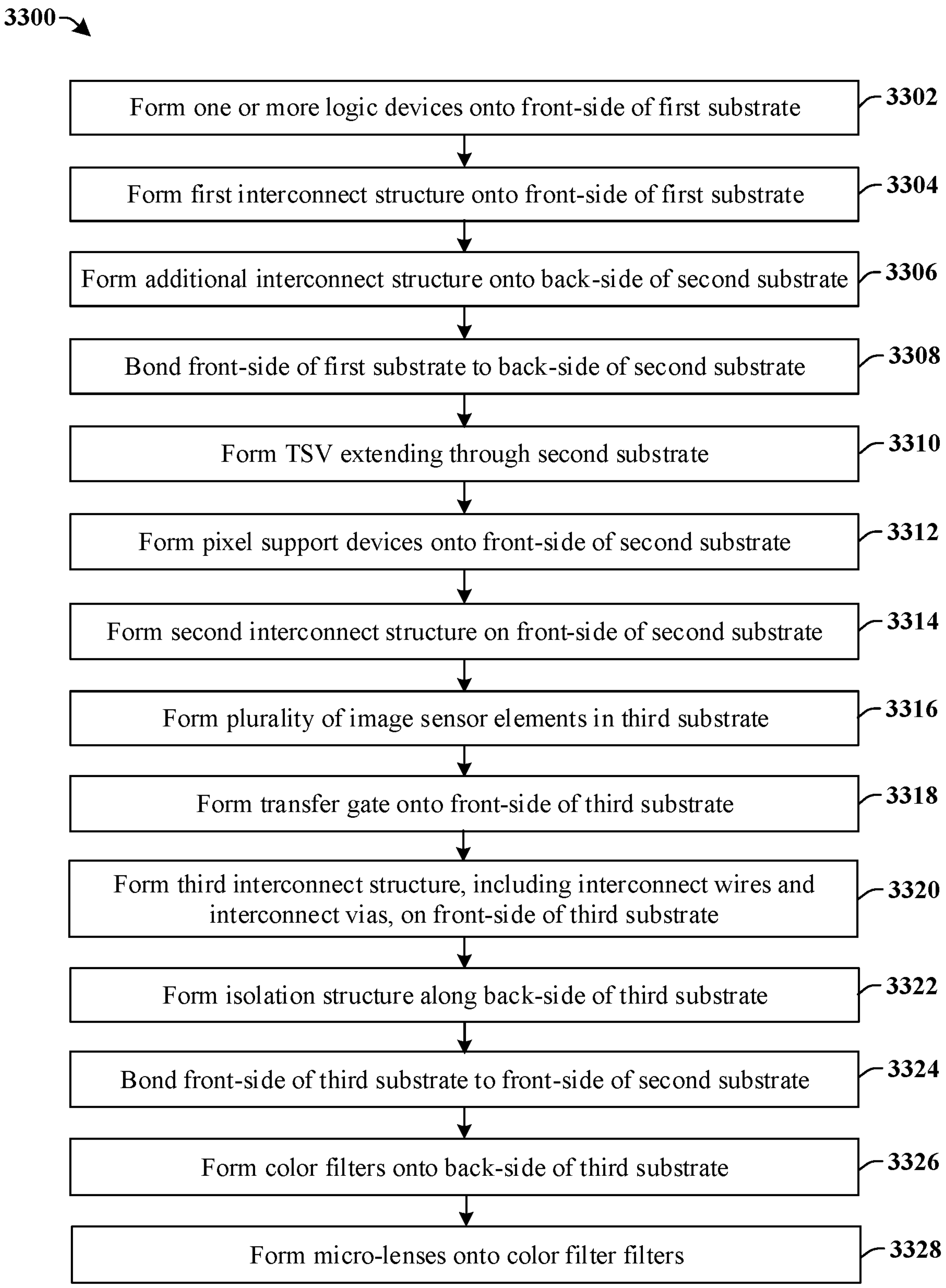
FIG. 33 illustrates a flow diagram of some embodiments of a method of forming an integrated chip structure comprising separate integrated chip tiers including image sensing elements and pixel support devices.

FIG. 33 illustrates a flow diagram of some embodiments of a method of forming an integrated chip structure comprising separate integrated chip tiers including image sensing elements and pixel support devices.

While method 3300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 3302, one or more logic devices are formed onto a front-side of a first substrate. FIG. 11 illustrates a cross-sectional view 1100 of some embodiments corresponding to act 3302.

Figure 12:
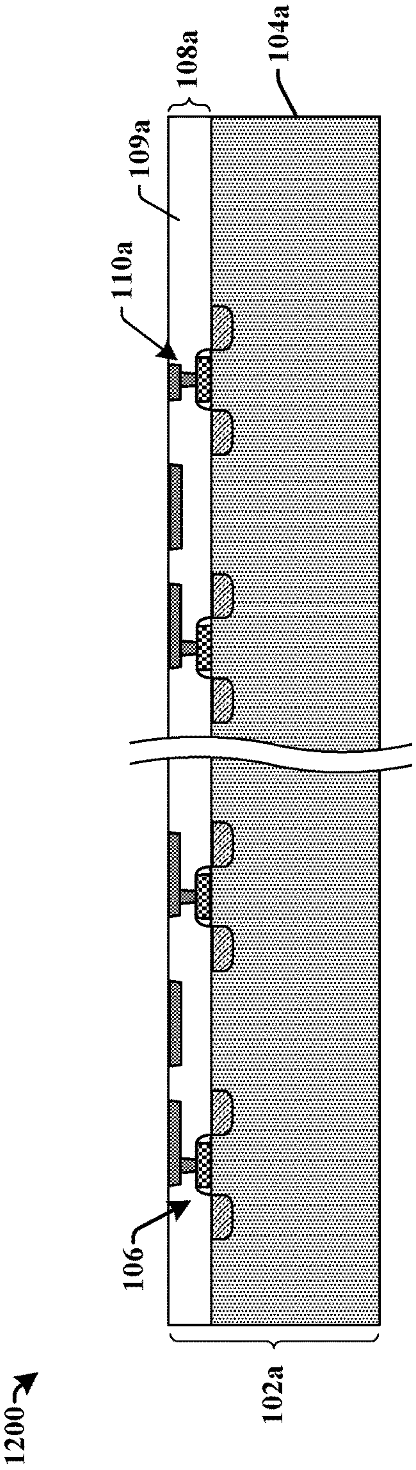

At act 3304, a first interconnect structure is formed onto the front-side of the first substrate. FIG. 12 illustrates a cross-sectional view 1300 of some embodiments corresponding to act 3304.

At act 3306, an additional interconnect structure is formed onto a back-side of a second substrate. FIG. 14 illustrates a cross-sectional view 1400 of some embodiments corresponding to act 3306.

At act 3308, the front-side of the first substrate is bonded to the back-side of the second substrate. FIG. 15 illustrates a cross-sectional view 1500 of some embodiments corresponding to act 3308.

At act 3310, a through-substrate-via (TSV) is formed to extend through the second substrate. FIG. 17 illustrates a cross-sectional view 1700 of some embodiments corresponding to act 3310.

At act 3312, a plurality of pixel support devices are formed onto a front-side of the second substrate. FIG. 18 illustrates a cross-sectional view 1800 of some embodiments corresponding to act 3312.

At act 3314, a second interconnect structure is formed onto the front-side of the second substrate. FIG. 19 illustrates a cross-sectional view 1900 of some embodiments corresponding to act 3314.

At act 3316, a plurality of image sensing elements are formed within a third substrate. FIG. 21 illustrates a cross-sectional view 2100 of some embodiments corresponding to act 3316.

At act 3318, a transfer gate is formed onto a front-side of the third substrate. FIG. 22 illustrates a cross-sectional view 2200 of some embodiments corresponding to act 3318.

At act 3320, a third interconnect structure is formed onto the front-side of the third substrate. The third interconnect structure comprises interconnect wires and interconnect vias. FIG. 23 illustrate cross-sectional views 2300 of some embodiments corresponding to act 3320.

At act 3322, an isolation structure is formed along a back-side of the third substrate. FIGS. 25-26 illustrate cross-sectional views 2500-2600 of some embodiments corresponding to act 3318.

At act 3324, the front-side of the third substrate is bonded to the front-side of the second substrate. FIG. 27 illustrates a cross-sectional view 2700 of some embodiments corresponding to act 3324.

At act 3326, color filters are formed onto a back-side of the third substrate. FIG. 31 illustrates a cross-sectional view 3100 of some embodiments corresponding to act 3326.

At act 3328, micro-lenses are formed onto the color filters. FIG. 32 illustrates a cross-sectional view 3200 of some embodiments corresponding to act 3328.

Accordingly, the present disclosure relates to an image sensor integrated chip structure that has image sensing elements (e.g., photodiodes) disposed on a different substrate than pixel support transistors (e.g., reset transistors, source-follower transistors, row-select transistors, etc.).

In some embodiments, the present disclosure relates to an image sensor integrated chip structure. The image sensor integrated chip structure includes one or more logic devices disposed within a first substrate and coupled to a first interconnect structure on the first substrate; a plurality of pixel support devices disposed along a first-side of a second substrate and coupled to a second interconnect structure on the second substrate, the first substrate being bonded to the second substrate; a plurality of image sensing elements disposed within a third substrate in pixel regions respectively including two or more of the plurality of image sensing elements; a plurality of transfer gates disposed on a first-side of the third substrate; and a third interconnect structure disposed on the first-side of the third substrate and including interconnect wires and interconnect vias confined between the first-side of second substrate and the first-side of the third substrate. In some embodiments, the second interconnect structure is bonded to the third interconnect structure along an interface including one or more metal interfaces and one or more dielectric interfaces. In some embodiments, the image sensor integrated chip structure further includes an isolation structure having a dielectric material disposed within a trench in the third substrate, the isolation structure surrounding the pixel regions and laterally separating adjacent image sensor regions respectively including a transfer gate of the plurality of transfer gates and an image sensing element of the plurality of image sensing elements; and one or more floating diffusion regions disposed within the third substrate and operable coupled to the transfer gate within the adjacent image sensor regions. In some embodiments, the third interconnect structure is configured to connect the one or more floating diffusion regions to the plurality of pixel support devices by way of the second interconnect structure. In some embodiments, the isolation structure extends vertically through the third substrate as viewed in a cross-sectional view; and the isolation structure continuously wraps around multiple sides of respective ones of the plurality of image sensing elements as viewed in a top-view. In some embodiments, the first-side of the third substrate includes a surface that continuously extends through an opening in the isolation structure from over a first image sensing element of the plurality of image sensing elements to over a second image sensing element of the plurality of image sensing elements. In some embodiments, the image sensor integrated chip structure further includes a first doped well region arranged within the opening. In some embodiments, the one or more floating diffusion regions are a single floating diffusion region shared between the adjacent image sensor regions. In some embodiments, the image sensor integrated chip structure further includes one or more additional isolation regions disposed within the third substrate below the one or more floating diffusion regions, the one or more additional isolation regions having a height that is less than a thickness of the third substrate. In some embodiments, the third interconnect structure includes a first interconnect wire contacting a first interconnect via, the first interconnect wire laterally extending past one or more outermost sidewalls of the first interconnect via.

In other embodiments, the present disclosure relates to an image sensor integrated chip structure. The image sensor integrated chip structure includes one or more transistor devices disposed on a first substrate and coupled to a first interconnect structure having first interconnects within a first inter-level dielectric (ILD) structure; an additional transistor disposed on a second substrate and coupled to a second interconnect structure having second interconnects disposed within a second ILD structure; an isolation structure disposed within a third substrate and wrapping around a pixel region including a plurality of image sensor regions, the plurality of image sensor regions respectively having an image sensing element and a transfer gate; a third interconnect structure disposed on the third substrate and having third interconnects disposed within a third ILD structure; and the second substrate being bonded to the third substrate along a bonding interface that includes one or more interfaces between the second interconnects and the third interconnects and one or more interfaces between the second ILD structure and the third ILD structure. In some embodiments, the image sensor integrated chip structure further includes a floating diffusion region electrically coupled to the transfer gate within the plurality of image sensor regions, the third interconnects being electrically coupled to the floating diffusion region; and the isolation structure extends between adjacent ones of the plurality of image sensor regions and includes sidewalls that face one another to form an opening extending between the adjacent ones of the plurality of image sensor regions, the floating diffusion region arranged between the sidewalls that form the opening. In some embodiments, the plurality of image sensor regions are arranged in an array having rows extending in a first direction and columns extending in a second direction perpendicular to the first direction, the isolation structure separating neighboring ones of the plurality of image sensor regions in the rows and in the columns. In some embodiments, the image sensor integrated chip structure further includes a floating diffusion region electrically coupled to the transfer gate within the plurality of image sensor regions, the third interconnects being electrically coupled to the floating diffusion region; and an opening extending through the isolation structure, the opening being located at corners of four of the plurality of image sensor regions and the floating diffusion region being located within the opening. In some embodiments, the image sensor integrated chip structure further includes a row-select transistor disposed on the second substrate; and a source-follower transistor disposed on the second substrate, the second interconnect structure electrically coupling a reset transistor to the row-select transistor and the source-follower transistor.

In yet other embodiments, the present disclosure relates to a method of forming an image sensor integrated chip structure. The method includes bonding a first-side of a first substrate to a second-side of a second substrate, so that a first interconnect structure is between the first substrate and the second substrate; forming a plurality of pixel support devices onto a first-side of the second substrate facing away from the first substrate; forming a second interconnect structure onto a first-side of the second substrate; forming a plurality of image sensing elements in a third substrate; forming a transfer gate onto a first-side of the third substrate; forming a third interconnect structure, including interconnect wires and interconnect vias, on the first-side of the third substrate; and bonding the first-side of the third substrate to the first-side of the second substrate. In some embodiments, the method further includes forming a through-substrate-via (TSV) extending through the second substrate, the TSV being configured to electrically couple the first interconnect structure to the second interconnect structure. In some embodiments, the method further includes forming an isolation structure to vertically extend completely through the third substrate, the isolation structure being configured to be laterally between adjacent ones of the plurality of image sensing elements. In some embodiments, the first-side of the third substrate includes a surface that continuously extends through an opening in the isolation structure from over a first image sensing element of the plurality of image sensing elements to over a second image sensing element of the plurality of image sensing elements. In some embodiments, the method further includes forming a first doped well region to be arranged along the first-side of the third substrate and within the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an image sensor integrated chip structure, comprising:

bonding a first-side of a first substrate to a second-side of a second substrate, so that a first interconnect structure is between the first substrate and the second substrate;

forming a plurality of pixel support devices onto a first-side of the second substrate facing away from the first substrate;

forming a second interconnect structure onto the first-side of the second substrate;

forming a plurality of image sensing elements in a third substrate, wherein the third substrate comprises an isolation structure between neighboring ones of the plurality of image sensing elements and one or more floating diffusion nodes that are electrically interconnected and shared between the neighboring ones of the plurality of image sensing elements having the isolation structure therebetween;

forming a transfer gate onto a first-side of the third substrate;

forming a third interconnect structure, including interconnect wires and interconnect vias, on the first-side of the third substrate; and bonding the first-side of the third substrate to the first-side of the second substrate.

2. The method of claim 1, further comprising:

forming a through-substrate-via (TSV) extending through the second substrate, the TSV being configured to electrically couple the first interconnect structure to the second interconnect structure.

3. The method of claim 1, wherein an opening laterally extends through the isolation structure, the opening being located at a crossroad of the isolation structure in a plan view; and wherein the one or more floating diffusion regions comprise a single floating diffusion node located within the opening.

4. The method of claim 3, wherein the first-side of the third substrate comprises a surface that continuously extends through a second opening in the isolation structure from over a first image sensing element of the plurality of image sensing elements to over a second image sensing element of the plurality of image sensing elements.

5. The method of claim 4, further comprising:

forming a first doped well region to be arranged along the first-side of the third substrate and within the second opening, the isolation structure being between the single floating diffusion node and the first doped well region.

6. The method of claim 1, wherein the one or more floating diffusion nodes comprise a single floating diffusion node; and wherein the isolation structure comprises first opposing sidewalls facing neighboring ones of the plurality of image sensing elements and second sidewalls extending between the first opposing sidewalls and facing opposing sides of the single floating diffusion node.

7. A method of forming an image sensor integrated chip structure, comprising:

forming one or more logic devices within a first substrate;

bonding a second substrate to the first substrate along a first bonding interface having a first plurality of metal regions and a first plurality of dielectric regions;

forming a plurality of pixel support devices along a surface of the second substrate that faces away from the first substrate;

forming a plurality of image sensing elements within pixel regions of a third substrate, the pixel regions respectively comprising two or more of the plurality of image sensing elements;

forming an isolation structure within the third substrate, the isolation structure wrapping around the pixel regions and extending between neighboring ones of the plurality of image sensing elements;

forming a first doped well region within the third substrate, wherein the first doped well region is arranged within an opening in the isolation structure that extends between the neighboring ones of the plurality of image sensing elements;

forming a plurality of transfer gates within the pixel regions of the third substrate; and bonding the second substrate to the third substrate along a second bonding interface having a second plurality of metal regions and a second plurality of dielectric regions.

8. The method of claim 7, further comprising:

forming a first interconnect structure on the first substrate, a second interconnect structure on the second substrate, and a third interconnect structure on the third substrate; and wherein the third interconnect structure comprises interconnect wires and interconnect vias confined between the second substrate and the third substrate.

9. The method of claim 8, further comprising:

forming a floating diffusion node within the third substrate, wherein the floating diffusion node is shared between a first image sensing element and a second image sensing element of the plurality of image sensing elements.

10. The method of claim 9, wherein the third interconnect structure is configured to connect the floating diffusion node to the plurality of pixel support devices by way of the second interconnect structure.

11. The method of claim 9, further comprising:

etching the third substrate to form one or more trenches laterally between adjacent ones of the plurality of image sensing elements and over the floating diffusion node, wherein the one or more trenches have a height over the floating diffusion node that is less than a thickness of the third substrate; and depositing a dielectric material within the one or more trenches to form the isolation structure.

12. The method of claim 11, wherein a first-side of the third substrate, which faces the second substrate, comprises a surface that continuously extends through an opening in the dielectric material from over the first image sensing element, to over the first doped well region, and to over the second image sensing element.

13. The method of claim 12, wherein the first doped well region is arranged between neighboring ones of the plurality of transfer gates along a first direction; and wherein the neighboring ones of the plurality of transfer gates continuously extend past opposing sides of the first doped well region along a second direction that is perpendicular to the first direction in a top-view.

14. The method of claim 7, wherein the plurality of pixel support devices comprise a reset transistor, a source-follower transistor, and a row-select transistor.

15. The method of claim 7, further comprising:

etching the third substrate to form one or more trenches surrounding the pixel regions and laterally separating adjacent image sensor regions that respectively comprise a transfer gate of the plurality of transfer gates and an image sensing element of the plurality of image sensing elements;

depositing a dielectric within the one or more trenches; and forming one or more floating diffusion regions within the third substrate, the one or more floating diffusion regions being operably coupled to the plurality of transfer gates within the adjacent image sensor regions.

16. A method of forming an image sensor integrated chip structure, comprising:

forming a plurality of pixel support devices onto a first-side of a first substrate, wherein the plurality of pixel support devices comprise a reset transistor, a source-follower transistor, and a row-select transistor;

forming a first interconnect structure onto the first-side of the first substrate;

forming a plurality of image sensing elements in a second substrate;

forming a plurality of transfer gates onto a first-side of the second substrate;

forming an isolation structure within the second substrate and wrapping around a pixel region comprising a plurality of image sensor regions, the plurality of image sensor regions respectively comprising one of the plurality of image sensing elements and one of the plurality of transfer gates;

performing an implantation process on the second substrate to form a floating diffusion region electrically coupled to the plurality of transfer gates within the plurality of image sensor regions;

wherein an opening laterally extends through the isolation structure, the opening being located at corners of four of the plurality of image sensor regions and the floating diffusion region being located within the opening;

forming a second interconnect structure, including interconnect wires and interconnect vias, on the first-side of the second substrate, the second interconnect structure being electrically coupled to the floating diffusion region; and bonding the first-side of the first substrate to the first-side of the second substrate.

17. The method of claim 16, wherein the isolation structure extends between two or more of the plurality of image sensor regions within the pixel region.

18. The method of claim 16, further comprising:

forming a first doped well region within a second opening laterally extending through the isolation structure between sides of two of the four of the plurality of image sensor regions.

19. The method of claim 16, wherein a height of the isolation structure varies at different lateral locations.

20. The method of claim 16, further comprising:

performing an implantation process to form a first doped well region arranged between neighboring ones of the plurality of image sensor regions along a first direction, and between sidewalls of the isolation structure along a second direction that is perpendicular to the first direction in a plan-view.

* * * * *